US012690127B2

(12) United States Patent
 Kikuchi et al.

(10) Patent No.: US 12,690,127 B2
(45) Date of Patent: Jul. 21, 2026

(54) PRINTED WIRING BOARD, PRINTED CIRCUIT BOARD, ELECTRONIC EQUIPMENT, AND HEAD MOUNTED DISPLAY

(71) Applicant: CANON KABUSHIKI KAISHA, Tokyo (JP)

(72) Inventors: Masanori Kikuchi, Kanagawa (JP); Shoji Matsumoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 230 days.

(21) Appl. No.: 18/758,826

(22) Filed: Jun. 28, 2024

(65) Prior Publication Data

US 2025/0024595 A1    Jan. 16, 2025

(30) Foreign Application Priority Data

Jul. 12, 2023    (JP) ................................. 2023-114352

(51) Int. Cl.
 *H05K 1/02* (2006.01)
(52) U.S. Cl.
 CPC ................................. *H05K 1/0298* (2013.01)
(58) Field of Classification Search
 CPC .................................................. H05K 1/0298
 USPC ........................................................ 174/251
 See application file for complete search history.

(56) References Cited

U.S. PATENT DOCUMENTS

| | | | |
|---|---|---|---|
| 7,355,864 B2 | 4/2008 | Matsumoto | |
| 9,456,489 B2 | 9/2016 | Kikuchi | |
| 9,907,155 B2 | 2/2018 | Numagi | |
| 10,306,761 B2 | 5/2019 | Numagi | |
| 10,477,686 B2 | 11/2019 | Miyasaka | |
| 10,716,211 B2 | 7/2020 | Numagi | |
| 11,019,719 B2 | 5/2021 | Matsumoto | |
| 11,043,525 B2 | 6/2021 | Matsumoto | |
| 11,610,930 B2 | 3/2023 | Matsumoto | |
| 2013/0214397 A1 | 8/2013 | Kawai | |
| 2013/0279134 A1* | 10/2013 | Hayashi | H05K 1/0216 |
| | | | 361/767 |
| 2014/0048323 A1 | 2/2014 | Wada | |

(Continued)

FOREIGN PATENT DOCUMENTS

| | | |
|---|---|---|
| JP | 2007-287750 A | 11/2007 |
| JP | 2010-212439 A | 9/2010 |
| JP | 2017-212411 A | 11/2017 |

*Primary Examiner* — Andargie M Aychillhum
(74) *Attorney, Agent, or Firm* — VENABLE LLP

(57) ABSTRACT

A printed wiring board includes: a substrate including first and second conductor layers laminated together, and a third conductor layer laminated on an outer side of one of the first conductor layer and the second conductor layer; a first differential signal wiring provided in the first conductor layer and including first and second wirings; a second differential signal wiring provided in the second conductor layer and including third and fourth wiring; a first via provided between the first and second conductor layers to connect the first wiring and the third wiring; and a second via provided between the first and second conductor layers to connect the second wiring and the fourth wiring, wherein a first clearance is provided for each of the first, second and third conductor layers to include the first via and the second via in a plan view viewed perpendicular to the substrate.

20 Claims, 24 Drawing Sheets

(56)          References Cited

U.S. PATENT DOCUMENTS

2014/0252612  A1      9/2014  Nakagawa
2015/0043183  A1*     2/2015  Ishiguro ................. H05K 1/185
                                                      174/251
2020/0260570  A1      8/2020  Chujo
2023/0133827  A1      5/2023  Matsumoto
2024/0023231  A1      1/2024  Matsumoto

* cited by examiner

PRINTED WIRING BOARD, PRINTED CIRCUIT BOARD, ELECTRONIC EQUIPMENT, AND HEAD MOUNTED DISPLAY

BACKGROUND OF THE INVENTION

Field of the Invention

The present invention relates to a printed wiring board, a printed circuit board, electronic equipment, and a head mounted display.

Description of the Related Art

With the digitization and speedup of electronic equipment, differential transmission has been widely used for high-frequency digital signals. The differential transmission method is characterized by being resistant to external noise and easily accelerated. However, when there is a difference in the length of the two signal wirings for transmitting the differential signal, a phase shift called skew occurs between the differential signals, and the transfer characteristics may deteriorate.

Therefore, in the differential transmission system, it is necessary to make the lengths of the two signal wirings physically close to the equal length. However, on the same printed circuit board, the positions of the output terminals of a P (Positive/Positive logic) signal and an N (Negative/Negative logic) signal of a device such as an IC (integrated circuit) do not always coincide with the positions of a P signal and an N signal of the connector. Consequently, the signal wirings are likely to be interchanged at some points, and the wiring length differences are likely to be generated at each layer between a signal wiring that transmits a P signal and a signal wiring that transmits an N signal, which results in a tendency for skew to increase.

Japanese Patent Application Laid-Open No. 2007-287750 proposes that interchanging wirings for a P signal and an N signal should be arranged by contriving vias and wirings, and that the wiring should be interchanged while maintaining the equal length of the wirings for each layer and the symmetry of vias, thereby making the wiring equal in length and preventing the occurrence of skew. In addition to this, there are cases in which meander wiring is used to maintain the equal length at each layer.

However, according to the technique disclosed in Japanese Patent Application Laid-Open No. 2007-287750, the number of vias used is increased and the wiring length is also increased. Therefore, the technique disclosed in Japanese Patent Application Laid-Open No. 2007-287750 has problems such as an increase in the wiring area and deterioration in the transfer characteristics (transmission characteristics). In addition, a similar problem with an increase in the wiring length also exists when using general meander wirings to maintain the equal length at each layer.

SUMMARY OF THE INVENTION

It is an object of the present invention to provide a printed wiring board capable of reducing skew in a differential signal, and to provide a printed circuit board, electronic equipment and a head mounted display that use the printed wiring board.

According to one aspect of the present invention, there is provided a printed wiring board including: a substrate including a first conductor layer and a second conductor layer laminated together, and a third conductor layer laminated on an outer side of one of the first conductor layer and the second conductor layer; a first differential signal wiring provided in the first conductor layer and including a first wiring and a second wiring; a second differential signal wiring provided in the second conductor layer and including a third wiring and a fourth wiring; a first via provided between the first conductor layer and the second conductor layer to connect the first wiring and the third wiring; and a second via provided between the first conductor layer and the second conductor layer to connect the second wiring and the fourth wiring, wherein a first clearance is provided for each of the first conductor layer, the second conductor layer, and the third conductor layer to include the first via and the second via in a plan view viewed perpendicular to the substrate.

Further features of the present invention will become apparent from the following description of exemplary embodiments with reference to the attached drawings.

BRIEF DESCRIPTION OF THE DRAWINGS

FIG. 8C is a plan view illustrating a conductor layer of the printed wiring board according to the fifth embodiment.

FIG. 8D is a plan view illustrating a conductor layer of the printed wiring board according to the fifth embodiment.

DESCRIPTION OF THE EMBODIMENTS

Background Technology

Prior to the description of the embodiment of the present invention, wirings of differential signal wirings in multilayer printed wiring boards will be described with reference to FIG. 14A to FIG. 14D. FIG. 14A to FIG. 14D are schematic diagrams for explaining isometric wirings and non-isometric wirings of the differential signal wirings in the multilayer printed wiring boards.

Figure 14A:
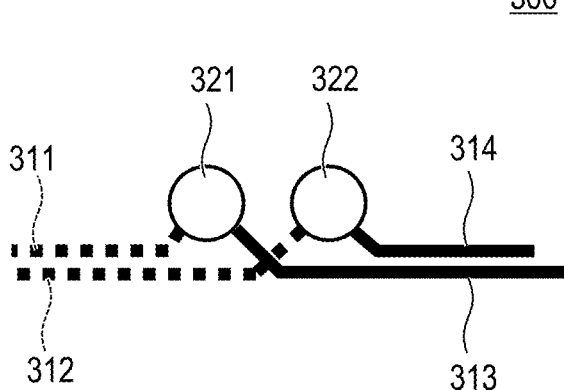
FIG. 14A is a schematic diagram illustrating isometric and non-isometric wirings of differential signal wirings in a multilayer printed wiring board.

FIG. 14A is a transparent view from a top view of a multilayer printed wiring board illustrating a differential signal wiring in which a wiring on a P side and a wiring on an N side are interchanged. The wiring on the P side transmits a P (Positive/Positive logic) signal in the differential signal. The wiring on the N side transmits an N (Negative/Negative logic) signal in the differential signal.

As illustrated in FIG. 14A, the multilayer printed wiring board 300 is provided with wirings 311 and 312 provided on the same layer each constituting a differential signal wiring, and wirings 313 and 314 provided on the same layer each constituting the differential signal wiring. The wirings 311 and 312 and the wirings 313 and 314 are provided in different layers. The wiring 311 is a wiring on the P side and is connected to the wiring 313 which is a wiring on the P side provided on a layer different from the wiring 311 through a via 321. The wiring 312 is a wiring on the N side and is connected to the wiring 314 which is a wiring on the N side provided on a layer different from the wiring 312 through a via 322. Note that, in FIG. 14A, the wiring 311 and 312 are illustrated as thick dashed lines, and the wiring 313 and 314 are illustrated as thick solid lines to distinguish between the wirings 311 and 312 and the wirings 313 and 314, which are provided in different layers from each other.

In FIG. 14A, the wiring 311 on the P side and the wiring 312 on the N side are arranged in order from the top to the bottom on the left side of the paper surface, while the wiring 313 on the P side and the wiring 314 on the N side are arranged in order from the bottom to the top on the right side of the paper surface. For this reason, the differential signal wiring illustrated in FIG. 14A is a wiring in which the wiring on the P side and the wiring on the N side are interchanged in different layers. Because the wiring on the P side and the wiring on the N side are interchanged in this manner, the differential signal wiring illustrated in FIG. 14A is in a state in which the symmetry of the wiring in each layer is broken and the wiring lengths are different between the wiring on the P side and the wiring on the N side, resulting in a state in which a skew generates.

Figure 14B:
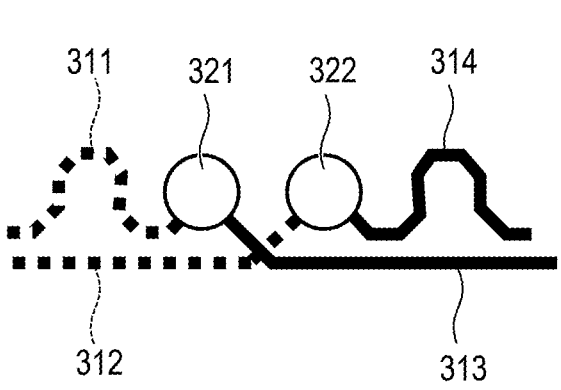
FIG. 14B is a schematic diagram illustrating isometric and non-isometric wirings of differential signal wirings in a multilayer printed wiring board.

As a skew countermeasure, a means for making the wiring in each layer equal in length is generally used. FIG. 14B is a transparent view from a top view of a multilayer printed wiring board in which making the wirings equal in length are performed to the wirings illustrated in FIG. 14A. As illustrated in FIG. 14B, the wiring 311 and the wiring 312 provided on the same layer are made uniform in length by adding a redundant wiring. Further, the wirings 313 and 314 provided on the same layer are made uniform in length by adding a redundant wiring. In the case illustrated in FIG. 14B, the skew is improved, but the transmission characteristics of the differential signal deteriorates because the wiring area increases and the wiring length also increases.

Figure 14C:
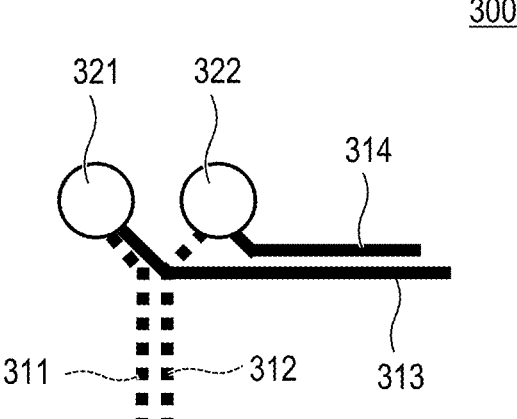
FIG. 14C is a schematic diagram illustrating isometric and non-isometric wirings of differential signal wirings in a multilayer printed wiring board.
Figure 14D:
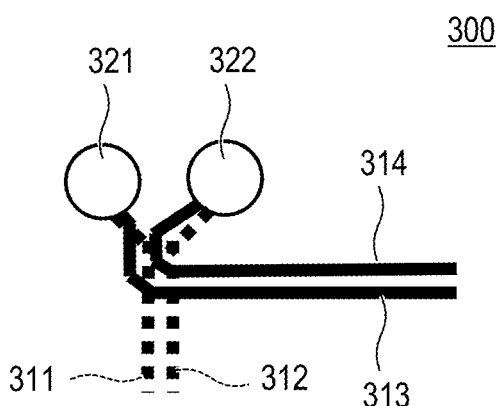
FIG. 14D is a schematic diagram illustrating isometric and non-isometric wirings of differential signal wirings in a multilayer printed wiring board.

FIG. 14C is a transparent view from a top view of a multilayer printed wiring board illustrating a differential signal wiring in which a wiring on a P side and a wiring on an N side are interchanged in a form different from that of FIG. 14A. In FIG. 14A, the differential signal wiring constituted by the wirings 311 and 312 and the differential signal wiring constituted by the wirings 313 and 314 are arranged on the left and right sides of the paper surface. On the other hand, in FIG. 14C, the differential signal wiring constituted by the wirings 313 and 314 is arranged so as to bend 90 degrees to the right side with respect to the differential signal wiring constituted by the wirings 311 and 312 on the lower side of the paper surface. Also in FIG. 14C, the P side and the N side are interchanged at the relative positions of the wiring 313 on the P side and the wiring 314 on the N side with respect to the relative positions of the wiring 311 on the P side and the wiring 312 on the N side. Therefore, in the differential signal wiring illustrated in FIG. 14C, the wiring on the P side and the wiring on the N side are interchanged at different layers. FIG. 14D is a transparent view from a top view of a multilayer printed wiring board in which making the wirings equal in length are performed to the wirings illustrated in FIG. 14C.

The printed wiring board according to the embodiments of the present invention described below can reduce the skew in the differential signal without increasing the wiring length and the area of the differential signal wiring, thereby reducing deterioration of transfer characteristics such as transmission characteristics of the differential signal.

First Embodiment

Figure 1A:
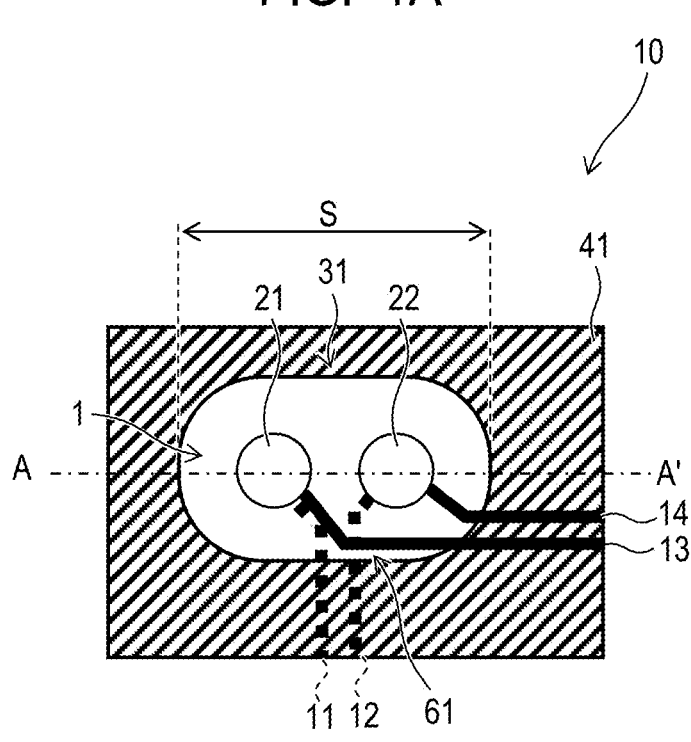
FIG. 1A is a transparent view from a top view illustrating a printed wiring board according to a first embodiment.
Figure 1B:
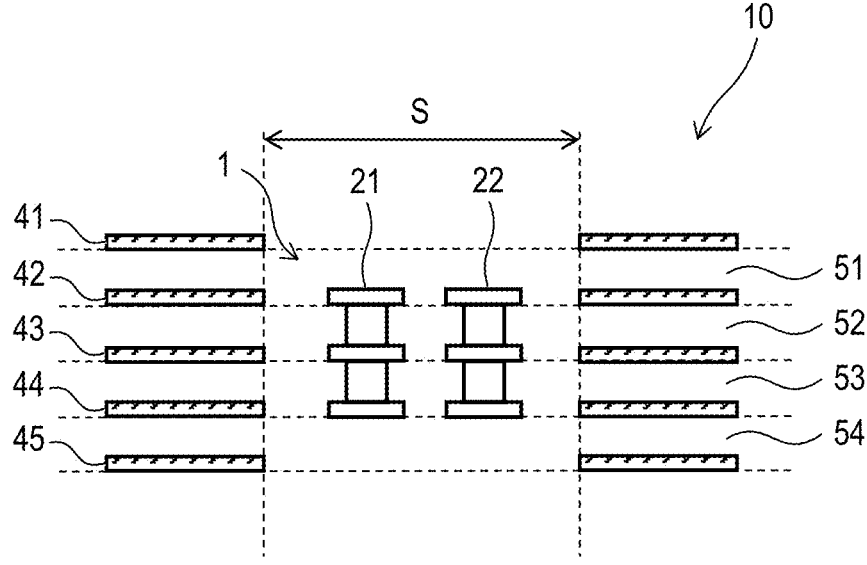
FIG. 1B is a cross-sectional view illustrating a cross section of the printed wiring board according to the first embodiment.
Figure 1C:
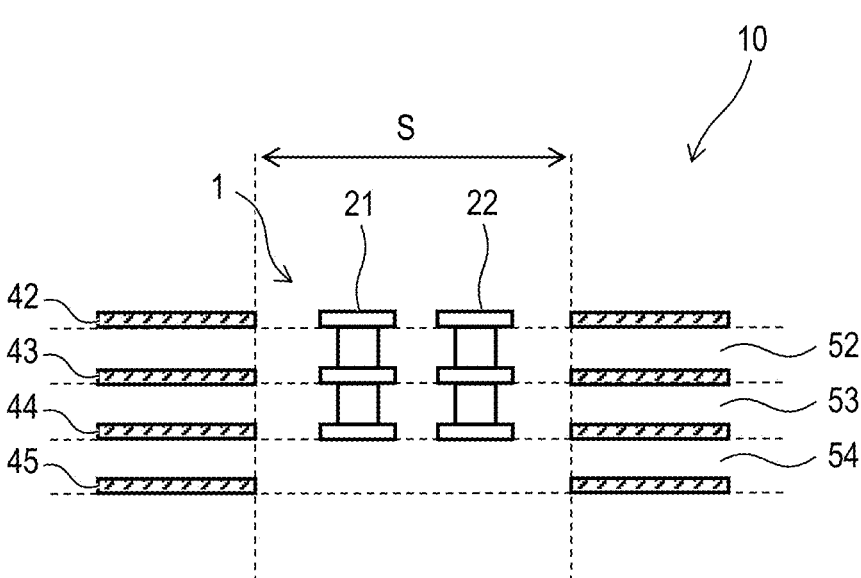
FIG. 1C is a cross-sectional view illustrating another example of a cross section of the printed wiring board according to the first embodiment.

A printed wiring board according to a first embodiment of the present invention will be described with reference to FIG. 1A to FIG. 2E. FIG. 1A is a transparent view from a top view illustrating the printed wiring board according to the present embodiment. FIG. 1B is a cross-sectional view illustrating a cross section of the printed wiring board according to the present embodiment. FIG. 1C is a cross-sectional view illustrating another example of a cross section of the printed wiring board according to the present embodiment. FIG. 2A to FIG. 2E are plan views illustrating respective conductor layers of the printed wiring board according to the present embodiment. FIG. 1A and FIG. 3A to FIG. 3F are views perpendicular to the printed wiring board. FIG. 1B and FIG. 1C illustrate cross sections along line A-A' in FIG. 1A in a vertical direction.

As illustrated in FIG. 1A and FIG. 1B, the printed wiring board 10 according to the present embodiment is a multilayer printed wiring board having five layered conductor layers 41, 42, 43, 44, and 45, and includes wirings 11 and 12, wirings 13 and 14, and vias 21 and 22. Note that the number of the conductor layers in the printed wiring board 10 is not limited to five layers. The number of the conductor layers in the printed wiring board 10 may be three or more layers including the conductor layers 42 provided with the wirings 11 and 12, the conductor layers 44 provided with the wirings 13 and 14, and at least one of the conductor layers 41 and 45.

The conductor layers 41, 42, 43, 44 and 45 are laminated in this order from the upper surface which is a first surface of the printed wiring board 10 to the lower surface which is a second surface via insulating layers 51, 52, 53, 54 and 55. That is, the conductor layer 41 and the conductor layer 42 are laminated via the insulating layer 51. The conductor layer 42 and the conductor layer 43 are laminated via the insulating layer 52. The conductor layer 43 and the conductor layer 44 are laminated via the insulating layer 53. The conductor layer 44 and the conductor layer 45 are laminated via the insulating layer 54. The conductor material constituting the conductor layers 41, 42, 43, 44 and 45 is not particularly limited, but is copper or the like. The laminated body of the conductor layers 41, 42, 43, 44 and 45 via the insulating layers 51, 52, 53, 54 and 55 is a plate-like substrate that serves as the main body of the printed wiring board 10. The substrate may be a rigid substrate or a flexible substrate.

The vias 21 and 22 are arranged adjacent to each other in the insulating layers 51, 52, and 53 between the conductor layer 42 and the conductor layer 44. The vias 21 and 22 have pads in the same layers as the conductor layers 42, 43, and 44, respectively. The via 21 electrically connect the wiring 11 and the wiring 13. The via 22 electrically connect wiring 12 and the wiring 14.

The wirings 11 and 12 are a pair of wiring constituting a differential signal wiring for transmitting a differential signal, and are provided on the conductor layer 42 and are provided on the same layer. The conductor layer 42 provided with the wirings 11 and 12 is a layer corresponding to the ends of the vias 21 and 22 on the upper surface side of the printed wiring board 10, and is the uppermost layer among the layers in which the vias 21 and 22 are present.

The wirings 13 and 14 are a pair of wirings constituting a differential signal wiring for transmitting a differential signal, and are provided on the conductor layer 44 and are provided on the same layer. The conductor layer 44 provided with the wirings 13 and 14 is a layer corresponding to the ends of the vias 21 and 22 on the lower surface side of the printed wiring board 10, and is the lowermost layer among the layers in which the vias 21 and 22 are present. The wirings 13 and 14 are arranged so as to bend at, for example, 90° with respect to the wirings 11 and 12.

Thus, the differential signal wiring having the wirings 11 and 12 and the differential signal wiring having the wirings 13 and 14 are provided on different layers. Note that, in FIG. 1A and the subsequent drawings, the wirings 11 and 12 are illustrated as thick dashed lines, and the wirings 13 and 14 are illustrated as thick solid lines to distinguish between the wirings 11 and 12 and the wirings 13 and 14 provided on different layers.

The wiring 11 are connected to the wirings 13 through the vias 21. The wiring 12 is connected to the wiring 14 through the via 22. For example, the wiring 11 and 13 are wirings on the P side, and the wiring 12 and 14 are wirings on the N side. The relative positions of the wiring on the P side and the wiring on the N side are interchanged between the wiring 11 and 12 and the wirings 13 and 14. Due to the interchange of the relative positions of the wirings, the wiring 12 which is one of the wirings 11 and 12 and the wiring 13 which is one of the wirings 13 and 14 have an intersecting region 61 in a plan view perpendicular to the printed wiring board 10. Since the wiring 12 and 13 are arranged so as to intersect, the wiring lengths of the wiring 11 and 13 and the wiring lengths of the wiring 12 and 14 are equal to each other. The wiring lengths of the wiring 11 and 13 and the wiring lengths of the wiring 12 and 14 may be different from each other.

Note that, in the present embodiment, the wiring 12 and the wiring 13 intersect each other in the plan view, but this is not necessarily limited thereto. The wirings 11, 12, 13 and 14 may be arranged so that one of the wirings 11 and 12 intersects one of the wirings 13 and 14 in the plan view. Further, the wirings 11, 12, 13 and 14 may be arranged so that the wiring 11 does not intersect any of the wirings 13 and 14 and the wiring 12 does not intersect any of the wirings 13 and 14 in the plan view as in fourth and fifth embodiments described later.

Each of the conductor layers 42, 43 and 44, which are layers in which the vias 21 and 22 are present, is provided with a clearance 1 having a size S around the vias 21 and 22, respectively. The conductor layer 41 laminated so as to be adjacent to the conductor layer 42, which is the uppermost layer in which the vias 21 and 22 are present, through the insulating layer 51 is also provided with a clearance 1 having a size S. Also, the conductor layer 45 laminated so as to be adjacent to the conductor layer 44, which is the lowermost layer in which the vias 21 and 22 are present, through the insulating layer 54 is provided with a clearance 1 having a size S so as to include the vias 21 and 22 corresponding to the periphery of the vias 21 and 22. The clearances 1 in the conductor layers 41, 42, 43, 44 and 45 are regions in which the conductors of the conductor layers 41, 42, 43, 44 and 45 are not provided, respectively.

Note that, as illustrated in FIG. 1C, the conductor layer 41 laminated adjacent to the outer side of the conductor layer 42, which is the uppermost layer in which the vias 21 and 22 are present, may not be provided. Although not illustrated, the conductor layer 45 laminated adjacent to the outer side of the conductor layer 44, which is the lowermost layer in which the vias 21 and 22 are present, may not be provided. That is, at least one of the conductor layers 41 and 45 provided with the clearance 1 may be provided, both of the conductor layers 41 and 45 may be provided, only one of the conductor layers 41 and 45 may be provided, or only the other of the conductor layers 41 and 45 may be provided.

FIG. 2A to FIG. 2E are plan views in which each layer of the printed wiring board 10 according to the present embodiment is viewed perpendicular to the printed wiring board 10.

Figure 2A:
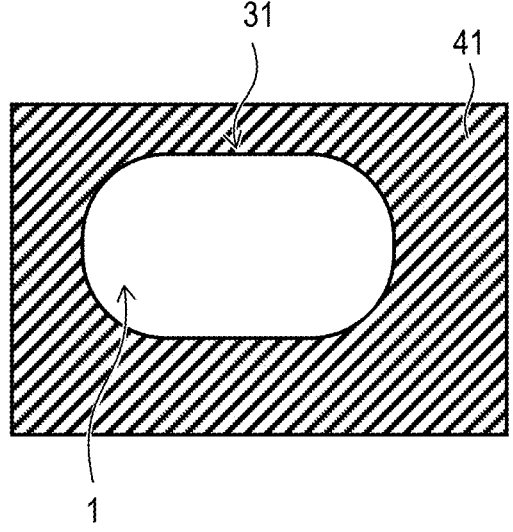
FIG. 2A is a plan view illustrating a conductor layer of the printed wiring board according to the first embodiment.

FIG. 2A illustrates the conductor layer 41 laminated on the outer side of the conductor layer 42 to be adjacent to the conductor layer 42, which is the uppermost layer in which the vias 21 and 22 are present, through the insulating layer 51. As illustrated in FIG. 2A, the clearance 1 is provided for the conductor layer 41 so as to include the vias 21 and 22 corresponding to the periphery of the vias 21 and 22. The conductor layer 41 around the clearance 1 is a ground plane (GND plane) 31.

Figure 2B:
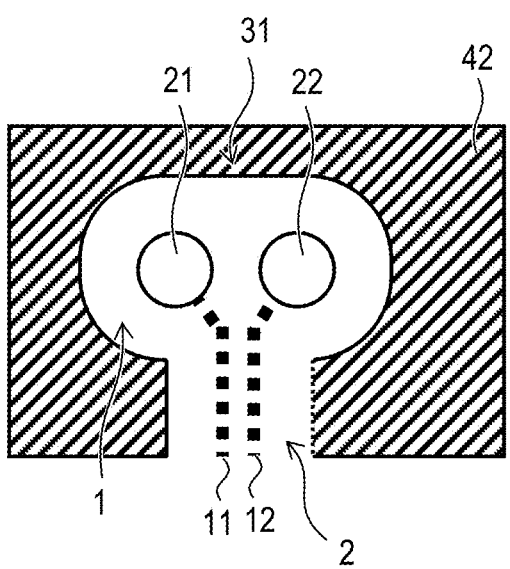
FIG. 2B is a plan view illustrating a conductor layer of the printed wiring board according to the first embodiment.

FIG. 2B illustrates the conductor layer 42, which is the uppermost layer in which the vias 21 and 22 are present. As illustrated in FIG. 2B, the clearance 1 is provided for the conductor layer 42 around the vias 21 and 22. Furthermore, an opening 2 is provided for the conductor layer 42 so as to be connected to the clearance 1 around and between the wirings 11 and 12 connected to the vias 21 and 22, respectively. The conductor layer 42 around the clearance 1 and the opening 2 is a GND plane 31.

Figure 2C:
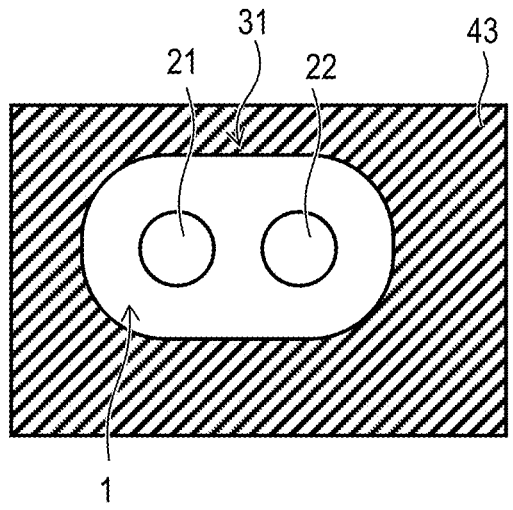
FIG. 2C is a plan view illustrating a conductor layer of the printed wiring board according to the first embodiment.

FIG. 2C illustrates the conductor layer 43, which is a middle layer in which the vias 21 and 22 are present. As illustrated in FIG. 2C, the clearance 1 is provided for the conductor layer 43 around the vias 21 and 22. The conductor layer 43 around the clearance 1 is a GND plane 31.

Figure 2D:
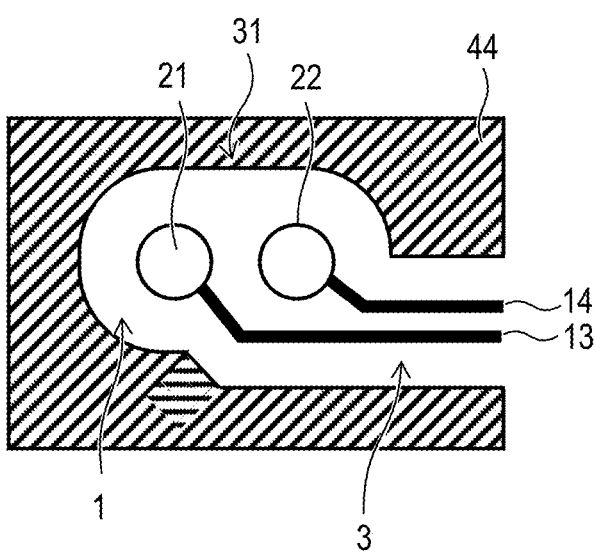
FIG. 2D is a plan view illustrating a conductor layer of the printed wiring board according to the first embodiment.

FIG. 2D illustrates the conductor layer 44, which is the lowermost layer in which the vias 21 and 22 are present. As illustrated in FIG. 2D, the clearance 1 is provided for the conductor layer 44 around the vias 21 and 22. Furthermore, an opening 3 is provided for the conductor layer 44 so as to be connected to the clearance 1 around and between the wirings 13 and 14 connected to the vias 21 and 22, respectively. The conductor layer 44 around the clearance 1 and the opening 3 is a GND plane 31.

Figure 2E:
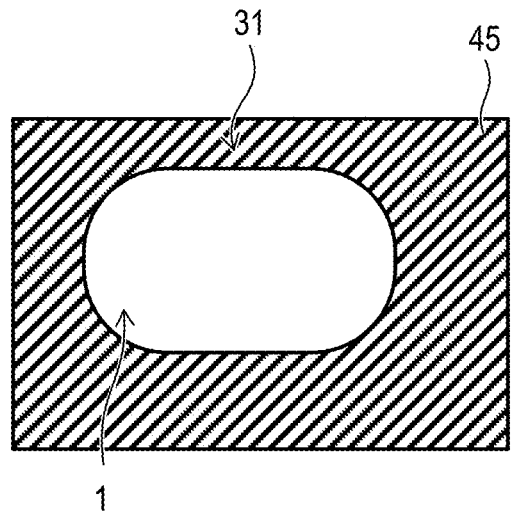
FIG. 2E is a plan view illustrating a conductor layer of the printed wiring board according to the first embodiment.

FIG. 2E illustrates the conductor layer 45 laminated on the outer side of the conductor layer 44 to be adjacent to the conductor layer 44, which is the lowermost layer in which the vias 21 and 22 are present, through the insulating layer 54. As illustrated in FIG. 2E, the clearance 1 is provided for the conductor layer 45 so as to include the vias 21 and 22 corresponding to the periphery of the vias 21 and 22. The conductor layer 45 around the clearance 1 is a GND plane 31.

The clearances 1 of the respective conductor layers 41, 42, 43, 44, and 45 have the same planar shape as each other, and are arranged so as to overlap and coincide with each other and include a region 61 in a plan view perpendicular to the printed wiring board 10. In the plan view, the clearances 1 include the vias 21 and 22 and are provided for the conductor layers 41, 42, 43, 44, and 45 so as to include the region 61 in which the wiring 12 and the wiring 13 intersect. In the plan view, the clearances 1 have an outer plane shape in which two arcs equidistant from the outer periphery of the vias 21 and 22 having a circular plane shape are connected by two parallel lines. The plane shape of the clearances 1 is not particularly limited, and may be a polygon such as a rectangle, an ellipse, a combination thereof, or the like, depending on the layout of the wirings 11, 12, 13, and 14, and the vias 21 and 22, or the like.

In the present embodiment, the clearances 1 are also provided for the conductor layers 41 and 45 adjacent to the outer sides of the uppermost and lowermost conductor layers 42 and 44 in which the vias 21 and 22 are present, for the wirings 11 and 12 and the wirings 13 and 14 in which the relative positions of the wiring on the P side and the wiring on the N side are interchanged. In the plan view perpendicular to the printed wiring board 10, the clearances 1 are provided for the conductor layers 41 and 45 so as to include the vias 21 and 22, and also include the region 61 in which the wiring 12 and the wiring 13 intersect. Such clearances 1 can enhance the coupling between the vias 21 and 22, the coupling between the wiring 11 and 12, the coupling between the wirings 13 and 14, the coupling between the vias 21 and 22 and the wiring 11 and 12, and the coupling between the vias 21 and 22 and the wirings 13 and 14. As a result, a crosstalk return current is generated between the wiring on the P side and the wiring on the N side, thereby reducing the skew between the P signal and the N signal in the differential signal.

Thus, according to the present embodiment, the skew in the differential signal can be reduced, thereby reducing the deterioration of the transfer characteristics such as the transmission characteristics of the differential signal. In the present embodiment, the length or area of the wiring in the printed wiring board 10 is not increased because the isometric wiring is not required.

Second Embodiment

Figure 3A:
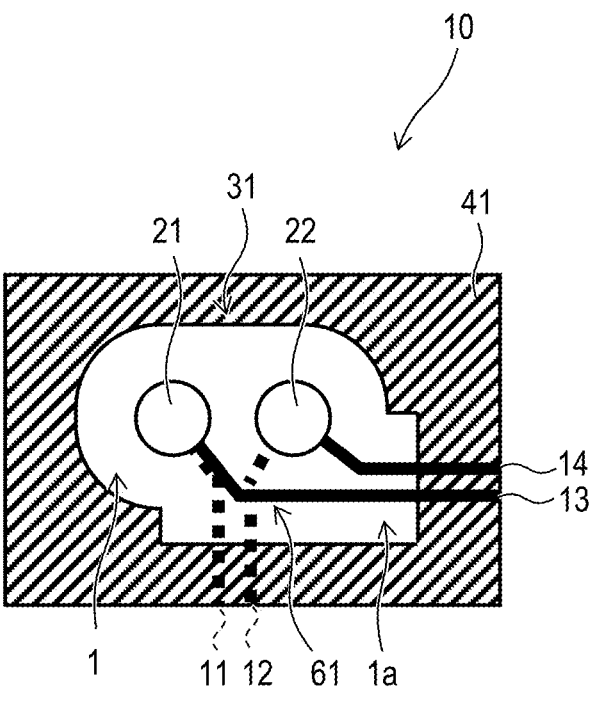
FIG. 3A is a transparent view from a top view illustrating a printed wiring board according to a second embodiment.

A printed wiring board according to a second embodiment of the present invention will be described with reference to FIG. 3A to FIG. 4. FIG. 3A is a transparent view from a top view illustrating the printed wiring board according to the present embodiment. FIG. 3B to FIG. 3F are plan views illustrating respective conductor layers of the printed wiring board according to the present embodiment. FIG. 4 is a plan view explaining clearances in the printed wiring board according to the present embodiment. FIG. 3A to FIG. 4 are views viewed perpendicular to the printed wiring board. Note that the same components as those in the first embodiment are labeled with the same reference numerals and the description thereof will be omitted or simplified.

As illustrated in FIG. 3A, the basic configuration of the printed wiring board 10 according to the present embodiment is the same as that of the first embodiment. In the present embodiment, the wirings 11 and 12 are connected to the wirings 13 and 14 via the vias 21 and 22 as in the first embodiment. Also in the present embodiment, as in the first embodiment, the wirings 12 which are one of the wirings 11 and 12 and the wirings 13 which are one of the wirings 13 and 14 have the intersecting region 61 in a plan view perpendicular to the printed wiring board 10.

The printed wiring board 10 according to the present embodiment differs from the first embodiment in terms of the range of clearance 1. FIG. 3B to FIG. 3F illustrate the clearances 1 provided for the conductor layers 41, 42, 43, 44, and 45 of the printed wiring board 10 according to the present embodiment.

Figure 3B:
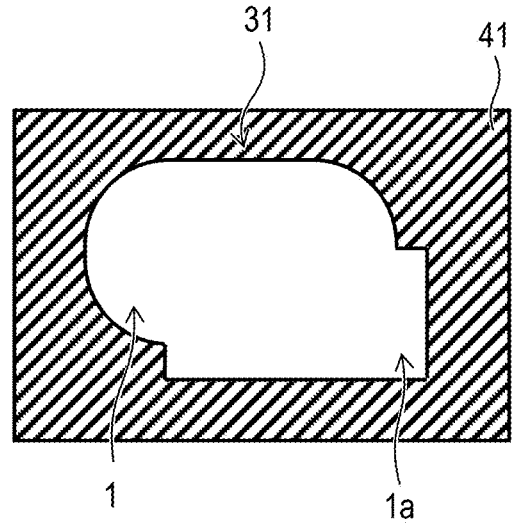
FIG. 3B is a plan view illustrating a conductor layer of the printed wiring board according to the second embodiment.
Figure 4:
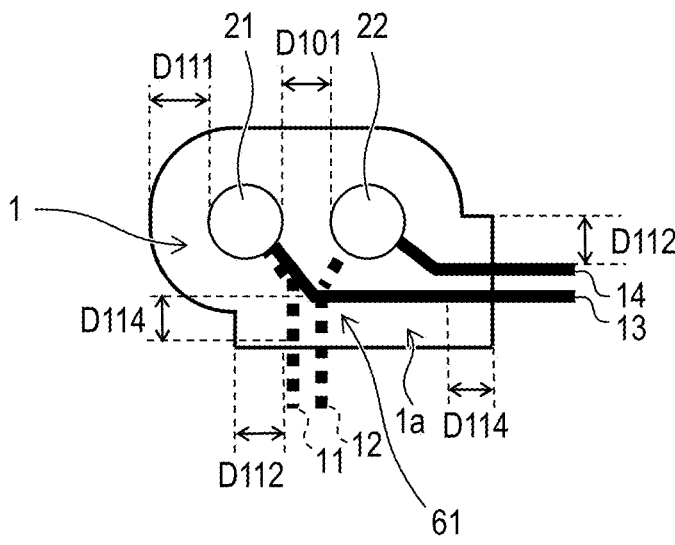
FIG. 4 is a plan view explaining clearance in the printed wiring board according to the second embodiment.

FIG. 3B illustrates the conductor layer 41 laminated on the outer side of the conductor layer 42 to be adjacent to the conductor layer 42, which is the uppermost layer in which the vias 21 and 22 are present, through the insulating layer 51. As illustrated in FIG. 3B, the clearance 1 including a clearance 1a is provided for the conductor layer 41 so as to include the vias 21 and 22 corresponding to the periphery of the vias 21 and 22. The conductor layer 41 around the clearances 1 and 1a is the GND plane 31.

Figure 3C:
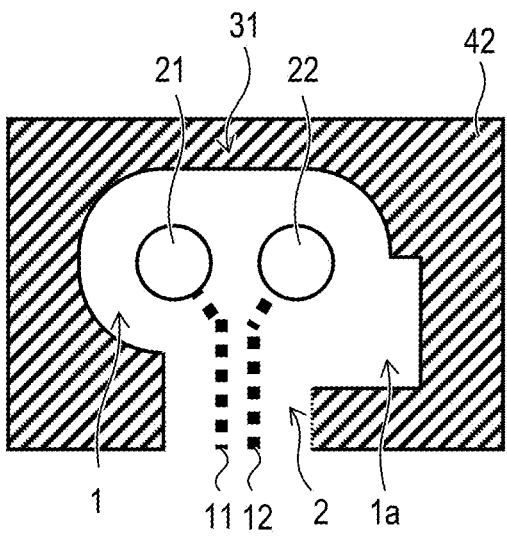
FIG. 3C is a plan view illustrating a conductor layer of the printed wiring board according to the second embodiment.

FIG. 3C illustrates the conductor layer 42, which is the uppermost layer in which the vias 21 and 22 are present. As illustrated in FIG. 3C, the clearance 1 including a clearance 1a is provided for the conductor layer 42 around the vias 21 and 22. Furthermore, the opening 2 is provided for the conductor layer 42 so as to be connected to the clearance 1 around and between the wirings 11 and 12 connected to the vias 21 and 22, respectively. The conductor layer 42 around the clearances 1 and 1a and the opening 2 is the GND plane 31.

Figure 3D:
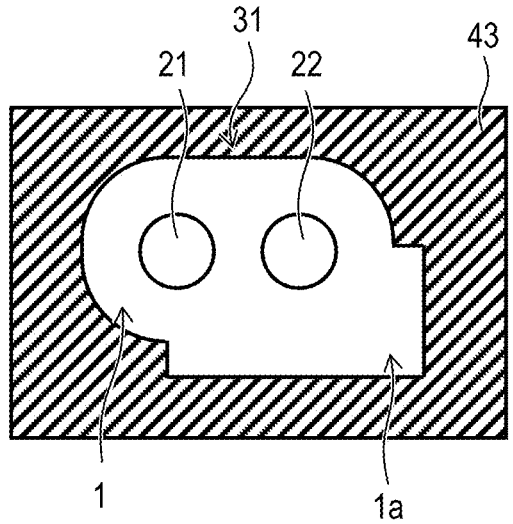
FIG. 3D is a plan view illustrating a conductor layer of the printed wiring board according to the second embodiment.

FIG. 3D illustrates the conductor layer 43, which is a middle layer in which the vias 21 and 22 are present. As illustrated in FIG. 3D, the clearance 1 including a clearance 1a is provided for the conductor layer 43 around the vias 21 and 22. The conductor layer 43 around the clearances 1 and 1a is the GND plane 31.

Figure 3E:
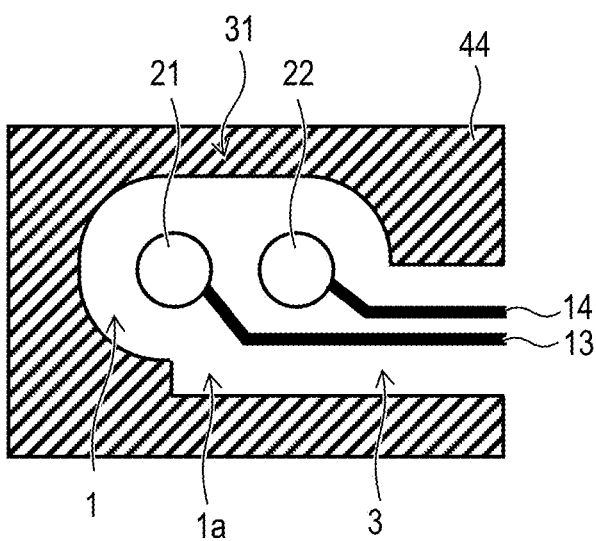
FIG. 3E is a plan view illustrating a conductor layer of the printed wiring board according to the second embodiment.

FIG. 3E illustrates the conductor layer 44, which is lowermost layer in which the vias 21 and 22 are present. As illustrated in FIG. 3E, the clearance 1 including a clearance 1a is provided for the conductor layer 44 around the vias 21 and 22. Furthermore, an opening 3 is provided for the conductor layer 44 so as to be connected to the clearance 1 around and between the wirings 13 and 14 connected to the vias 21 and 22, respectively. The conductor layer 44 around the clearances 1 and 1a and the opening 3 is the GND plane 31.

Figure 3F:
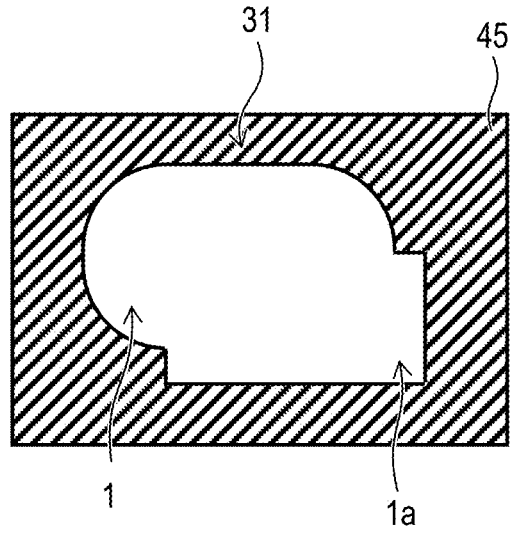
FIG. 3F is a plan view illustrating a conductor layer of the printed wiring board according to the second embodiment.

FIG. 3F illustrates the conductor layer 45 laminated on the outer side of the conductor layer 44 to be adjacent to the conductor layer 44, which is the lowermost layer in which the vias 21 and 22 are present, through the insulating layer 54. As illustrated in FIG. 3F, the clearance 1 including a clearance 1a is provided for the conductor layer 45 so as to include the vias 21 and 22 corresponding to the periphery of the vias 21 and 22. The conductor layer 45 around the clearances 1 and 1a is the GND plane 31.

The clearances 1 including the clearances 1a of the respective conductor layers 41, 42, 43, 44, and 45 have the same planar shape as each other and are arranged so as to coincide with each other in a plan view viewed perpendicular to the printed wiring board 10. In the plan view, the clearances 1 include vias 21 and 22, and are provided for the respective conductor layers 41, 42, 43, 44, and 45 so as to include the region 61 in which the wiring 12 and the wiring 13 intersect.

Here, the details of the clearance 1 including the clearance 1a according to the present embodiment will be described with reference to FIG. 4. As illustrated in FIG. 4, in a plan view viewed perpendicular to the printed wiring board 10, the clearance 1 include vias 21 and 22 and the region 61 in which the wirings 12 and 13 intersect. The clearance 1 are set to leave a distance D111 between the vias 21 and 22 and the GND plane 31 of each layer. Further, the clearance 1a included in the clearance 1 is set with respect to a distance D101 between the vias 21 and 22 for the wirings 11, 12, 13 and 14 as described below. Here, the distance D101 between the vias 21 and 22 is a distance between the pad portion of the via 21 and the pad portion of the via 22 in the plan view viewed perpendicular to the printed wiring board 10.

In each of the pair of the wirings 11 and 12 and the pair of the wirings 13 and 14, a draw-out portion for the vias 21 and 22 and a main portion away from the vias 21 and 22 differ in a wiring width and a spacing between the wirings. In the main portion which is a portion away from the vias 21 and 22, a constant wiring width and a constant spacing between the wirings determined for each layer are set as differential signal wirings. That is, the wirings 11 and 12 have a draw-out portion for the vias 21 and 22 in which the width of both wirings and the spacing between both wirings vary, and a main portion in which the width of both wirings and the spacing between both wirings are constant. Further, the wirings 13 and 14 have a draw-out portion for the vias 21 and 22 in which the width of both wirings and the spacing between both wirings vary, and a main portion in which the width of both wirings and the spacing between both wirings are constant.

The clearance 1a is set as follows with reference to the distance D101 between the vias 21 and 22 in the plan view viewed perpendicular to the printed wiring board 10. That is, the clearance 1a is set to a range in which a distance D114 overlapped with the wirings 11 and 12 set at a constant wiring width and a constant spacing between the wirings is preferably larger than the distance D101 with respect to the wirings 11 and 12 as viewed from the draw-out portion with respect to the vias 21 and 22. The clearance 1a is set to a range in which the distance D114 overlapped with the wirings 13 and 14 set at a constant wiring width and a constant spacing between the wirings is preferably larger than the distance D101 with respect to the wirings 13 and 14 as viewed from the draw-out portions with respect to the vias 21 and 22. Further, the clearance 1a is set to leave at least a distance D112 between the wirings 11 and 12 and the wirings 13 and 14 and the GND plane 31 of each layer. Note that the clearance 1a may be set to a range in which the clearance 1a overlaps the wirings 11, 12, 13 and 14 set to a constant wiring width and a constant spacing between the wirings in a plan view viewed perpendicular to the printed wiring board 10.

As in the present embodiment, the clearance 1 may be set to include the clearance 1a. Thus, according to the present embodiment, the skew between the P signal and the N signal in the differential signal can be further reduced.

Third Embodiment

Figure 5A:
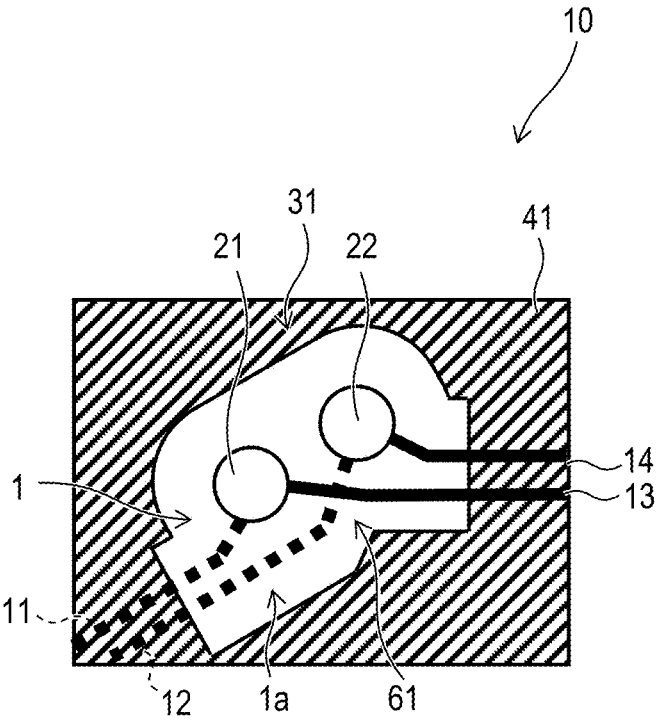
FIG. 5A is a transparent view from a top view illustrating a printed wiring board according to a third embodiment.

A printed wiring board according to a third embodiment of the present invention will be described with reference to FIG. 5A to FIG. 6. FIG. 5A is a transparent view from a top view illustrating the printed wiring board according to the present embodiment. FIG. 5B to FIG. 5F are plan views illustrating respective conductor layers of the printed wiring board according to the present embodiment. FIG. 6 is a plan view explaining clearances in the printed wiring board according to the present embodiment. FIG. 5A to FIG. 6 are views viewed perpendicular to the printed wiring board. Note that the same components as those in the first and second embodiments are labeled with the same reference numerals and the description thereof will be omitted or simplified.

As illustrated in FIG. 5A, the basic configuration of the printed wiring board 10 according to the present embodiment is the same as that of the second embodiment. In the present embodiment, the wirings 11 and 12 are connected to the wirings 13 and 14 via the vias 21 and 22 as in the second embodiment. Also in the present embodiment, as in the second embodiment, the wirings 12 which are one of the wirings 11 and 12 and the wirings 13 which are one of the wirings 13 and 14 have the intersecting region 61 in a plan view perpendicular to the printed wiring board 10.

The printed wiring board 10 according to the present embodiment differs from the first and second embodiments in terms of the positional relationship between the vias 21 and 22 and the positional relationship between the wirings 11 and 12 and the wirings 13 and 14. In the present embodiment, the wirings 13 and 14 are arranged so as to bend at an obtuse angle with respect to the wirings 11 and 12. The angle at which the wirings 13 and 14 are arranged so as to bend with respect to the wirings 11 and 12 is not limited to an obtuse angle, and may be 90° as in the first embodiment or an acute angle. The vias 21 and 22 are arranged in a positional relationship corresponding to the angle at which the wirings 13 and 14 are arranged so as to bend with respect to the wirings 11 and 12.

FIG. 5B to FIG. 5F illustrate the clearances 1 provided for the conductor layers 41, 42, 43, 44 and 45 of the printed wiring board 10 according to the present embodiment. In the present embodiment, the clearance 1 including the clearance 1a is also provided as in the second embodiment.

Figure 5B:
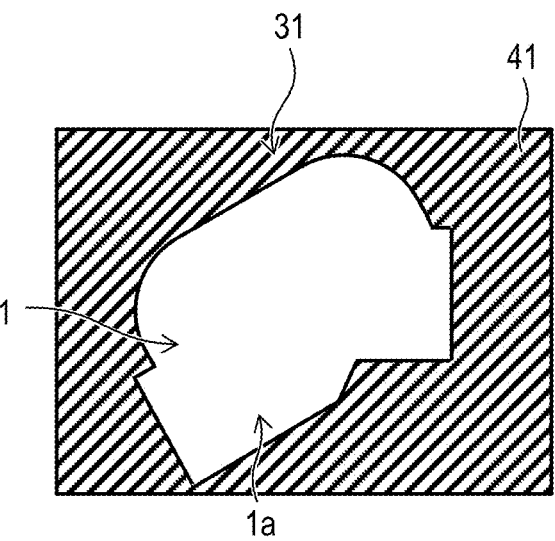
FIG. 5B is a plan view illustrating a conductor layer of the printed wiring board according to the third embodiment.
Figure 6:
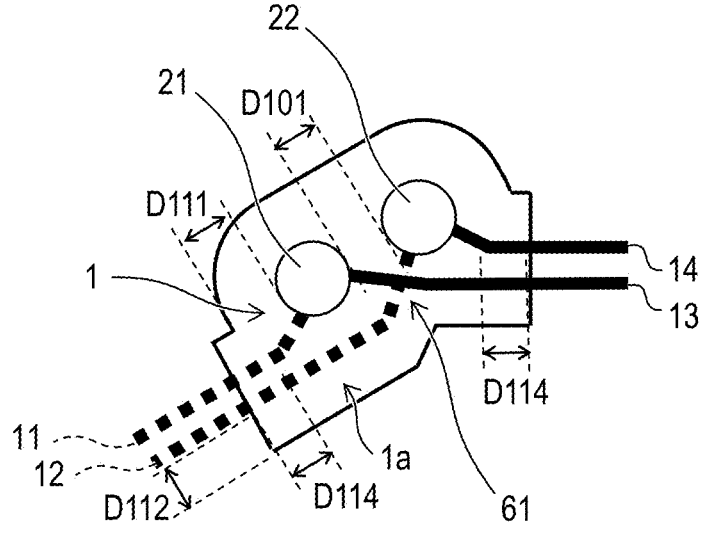
FIG. 6 is a plan view explaining clearance in the printed wiring board according to the third embodiment.

FIG. 5B illustrates the conductor layer 41 adjacent to the outer side of the conductor layer 42, which is the uppermost layer in which the vias 21 and 22 are present. As illustrated in FIG. 5B, the clearance 1 including the clearance 1a is provided for the conductor layer 41 so as to include the vias 21 and 22 corresponding to the periphery of the vias 21 and 22. The conductor layer 41 around the clearances 1 and 1a is the GND plane 31.

Figure 5C:
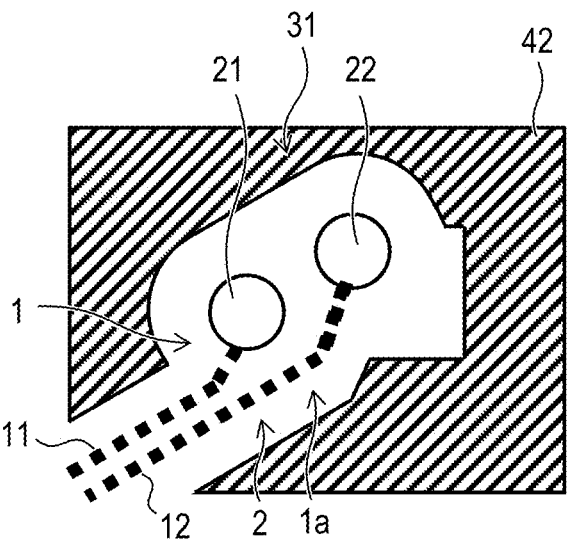
FIG. 5C is a plan view illustrating a conductor layer of the printed wiring board according to the third embodiment.

FIG. 5C illustrates the conductor layer 42, which is the uppermost layer in which the vias 21 and 22 are present. As illustrated in FIG. 5C, the clearance 1 including the clearance 1a is provided for the conductor layer 42 around the vias 21 and 22. Furthermore, the opening 2 is provided for the conductor layer 42 so as to be connected to the clearance 1 around and between the wirings 11 and 12 connected to the vias 21 and 22, respectively. The conductor layer 42 around the clearances 1 and 1a and the opening 2 is the GND plane 31.

Figure 5D:
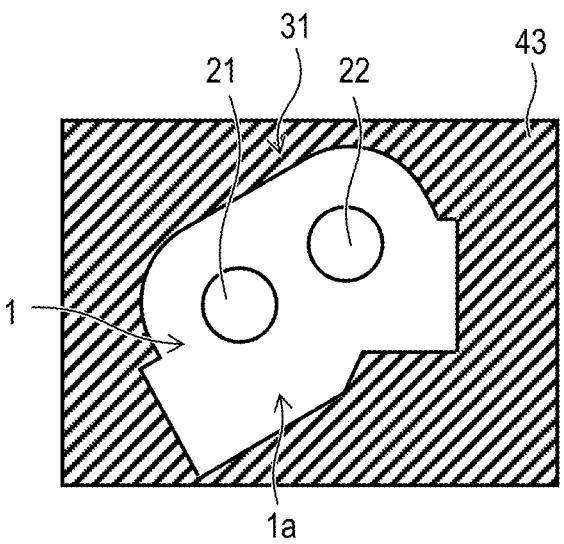
FIG. 5D is a plan view illustrating a conductor layer of the printed wiring board according to the third embodiment.

FIG. 5D illustrates the conductor layer 43, which is a middle layer in which the vias 21 and 22 are present. As illustrated in FIG. 5D, the clearance 1 including the clearance 1a is provided for the conductor layer 43 around the vias 21 and 22. The conductor layer 43 around the clearances 1 and 1a is the GND plane 31.

Figure 5E:
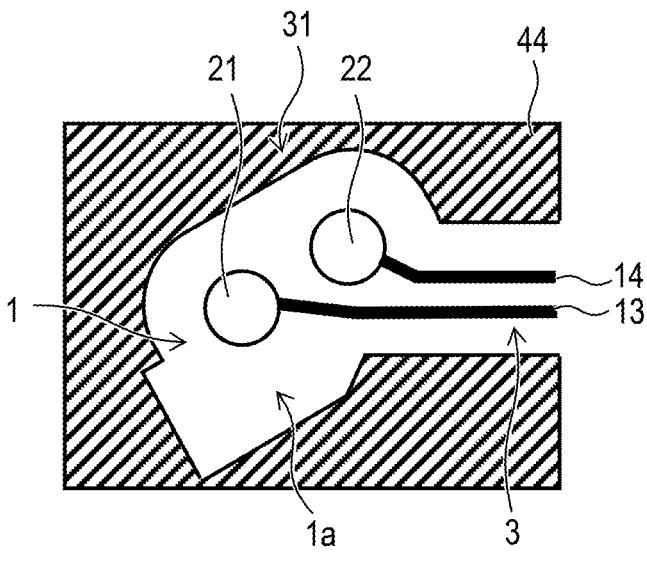
FIG. 5E is a plan view illustrating a conductor layer of the printed wiring board according to the third embodiment.

FIG. 5E illustrates conductor layer 44, which is the lowermost layer in which the vias 21 and 22 are present. As illustrated in FIG. 5E, the clearance 1 including the clearance 1a is provided for the conductor layer 44 around the vias 21 and 22. Furthermore, the opening 3 is provided for the conductor layer 44 so as to be connected to the clearance 1 around and between the wirings 13 and 14 connected to the vias 21 and 22, respectively. The conductor layer 44 around the clearances 1 and 1a and the opening 3 is the GND plane 31.

Figure 5F:
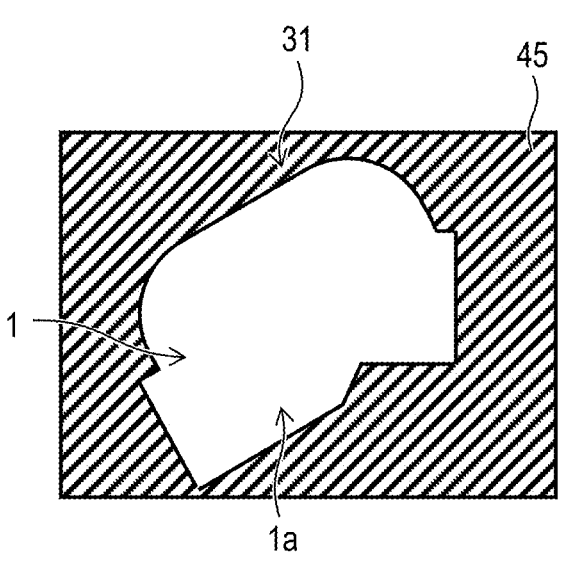
FIG. 5F is a plan view illustrating a conductor layer of the printed wiring board according to the third embodiment.

FIG. 5F illustrates the conductor layer 45 adjacent to the outer side of the conductor layer 44, which is the lowermost layer in which the vias 21 and 22 are present. As illustrated in FIG. 5F, the clearance 1 including the clearance 1a is provided for the conductor layer 45 so as to include the vias 21 and 22 corresponding to the periphery of the vias 21 and 22. The conductor layer 45 around the clearances 1 and 1a is the GND plane 31.

The clearances 1 including the clearances 1a of the respective conductor layers 41, 42, 43, 44, and 45 have the same planar shape as each other and are arranged so as to coincide with each other in a plan view viewed perpendicular to the printed wiring board 10. In the plan view, the clearances 1 including the clearances 1a include the vias 21 and 22 and are provided for the respective conductor layers 41, 42, 43, 44, and 45 so as to include the region 61 in which the wiring 12 and the wiring 13 intersect.

FIG. 6 illustrates the details of the clearance 1 including the clearance 1a according to the present embodiment. FIG. 6 differs from FIG. 4 in the positional relationship between the vias 21 and 22 and the positional relationship between the wirings 11 and 12 and the wirings 13 and 14.

In the present embodiment as in the second embodiment, the clearance 1a is set as follows with respect to the distance D101 between the vias 21 and 22 in a plan view viewed perpendicular to the printed wiring board 10. That is, the clearance 1a is set to a range in which a distance D114 overlapped with the wiring 11 and 12 set at a constant wiring width and a constant spacing between the wirings is larger than the distance D101 with respect to the wirings 11 and 12 as viewed from the draw-out portion with respect to the vias 21 and 22. Furthermore, the clearance 1a is set to a range in which the distance D114 overlapped with the wirings 13 and 14 set at a constant wiring width and a constant spacing between the wirings is larger than the distance D101 with respect to the wirings 13 and 14 as viewed from the draw-out portion with respect to the vias 21 and 22. Note that the clearance 1a may be set to a range in which the clearance 1a overlaps with the wirings 11, 12, 13 and 14 set at a constant wiring width and a constant spacing between the wirings in a plan view perpendicular to the printed wiring board 10.

As in the present embodiment, the positional relationship between the vias 21 and 22 and the positional relationship between the wirings 11 and 12 and the wirings 13 and 14 can be appropriately set according to the wiring layout, and the like.

Fourth Embodiment

Figure 7A:
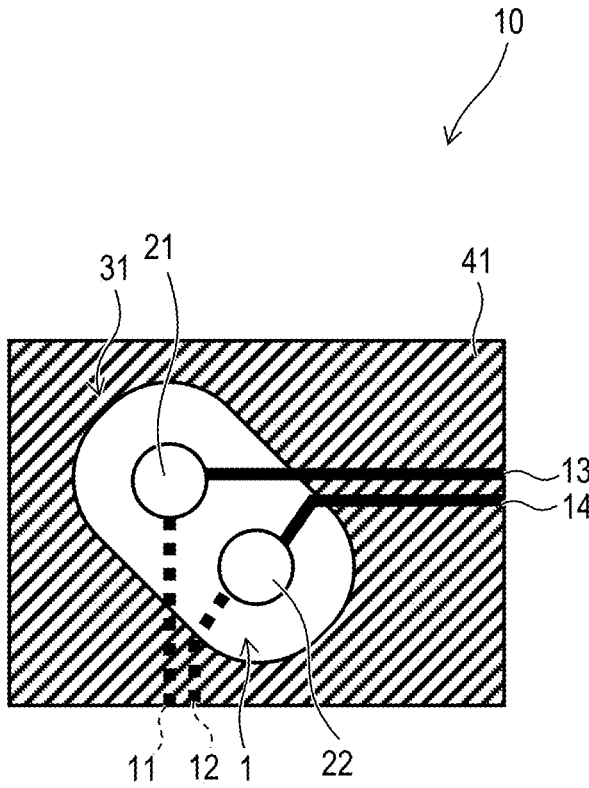
FIG. 7A is a transparent view from a top view illustrating a printed wiring board according to a fourth embodiment.

A printed wiring board according to a fourth embodiment of the present invention will be described with reference to FIG. 7A to FIG. 7F. FIG. 7A is a transparent view from a top view illustrating a printed wiring board according to the present embodiment. FIG. 7B to FIG. 7F are plan views illustrating respective conductor layers of a printed wiring board according to the present embodiment. FIG. 7A to FIG. 7F are views viewed perpendicular to the printed wiring board. Note that the same components as those in the first to third embodiments are labeled with the same reference numerals and the description thereof will be omitted or simplified.

As illustrated in FIG. 7A, the printed wiring board 10 according to the present embodiment differs from the first embodiment in that the relative positions of the wiring on the P side and the wiring on the N side are not interchanged between the wirings 11 and 12 and the wirings 13 and 14. The printed wiring board 10 according to the present embodiment differs from the first embodiment in the drawing directions of the wirings 11, 12, 13 and 14 and the positional relationship of the vias 21 and 22. The configuration of the printed wiring board 10 according to the present embodiment other than these points is the same as that of the first embodiment. In the present embodiment, since the wirings are not interchanged, the wiring 11 does not intersect with any of the wirings 13 and 14 and the wiring 12 does not intersect with any of the wirings 13 and 14 in a plan view perpendicular to the printed wiring board 10. However, although the wirings are not interchanged in the present embodiment, the wiring lengths of the wirings 11 and 13 and the wiring lengths of the wirings 12 and 14 are different from each other due to the drawing directions of the wirings 11, 12, 13 and 14 and the positional relationship of the vias 21 and 22, and a difference occurs between both the wiring lengths.

FIG. 7B to FIG. 7F illustrate the clearances 1 provided for the conductor layers 41, 42, 43, 44 and 45 of the printed wiring board 10 according to the present embodiment. In the present embodiment, as in the first embodiment, the clearance 1 is provided in accordance with the drawing directions of the wirings 11, 12, 13 and 14 and the positional relationship of the vias 21 and 22.

Figure 7B:
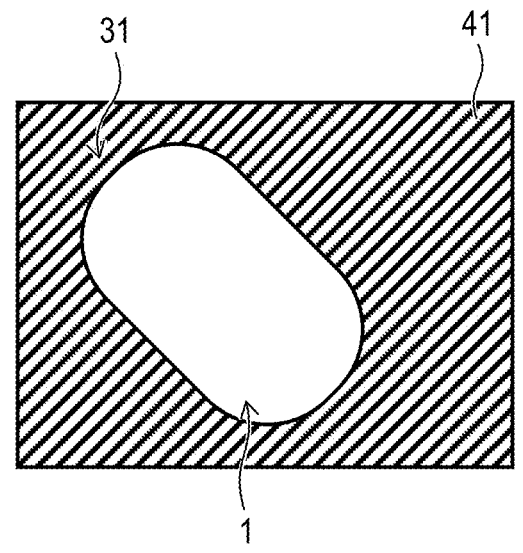
FIG. 7B is a plan view illustrating a conductor layer of the printed wiring board according to the fourth embodiment.

FIG. 7B illustrates the conductor layer 41 adjacent to the outer side of the conductor layer 42, which is the uppermost layer in which the vias 21 and 22 are present. As illustrated in FIG. 7B, the clearance 1 is provided for the conductor layer 41 so as to include the vias 21 and 22 corresponding to the periphery of the vias 21 and 22. The conductor layer 41 around the clearance 1 is the GND plane 31.

Figure 7C:
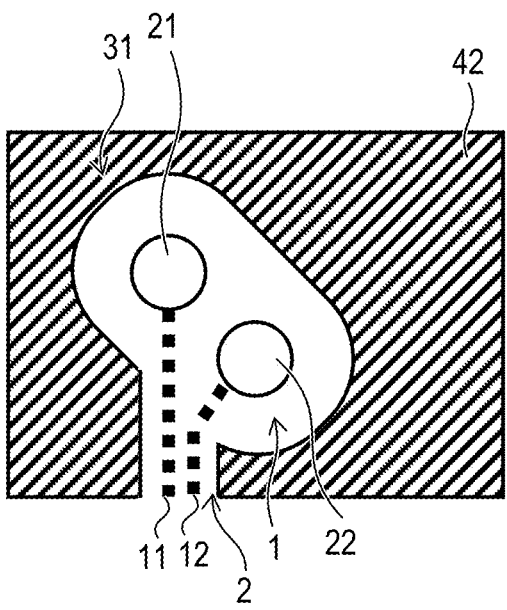
FIG. 7C is a plan view illustrating a conductor layer of the printed wiring board according to the fourth embodiment.

FIG. 7C illustrates the conductor layer 42, which is the uppermost layer in which the vias 21 and 22 are present. As illustrated in FIG. 7C, the clearance 1 is provided for the conductor layer 42 around the vias 21 and 22. Furthermore, the opening 2 is provided for the conductor layer 42 so as to be connected to the clearance 1 around and between wirings 11 and 12 connected to the vias 21 and 22, respectively. The conductor layer 42 around the clearance 1 and the opening 2 is the GND plane 31.

Figure 7D:
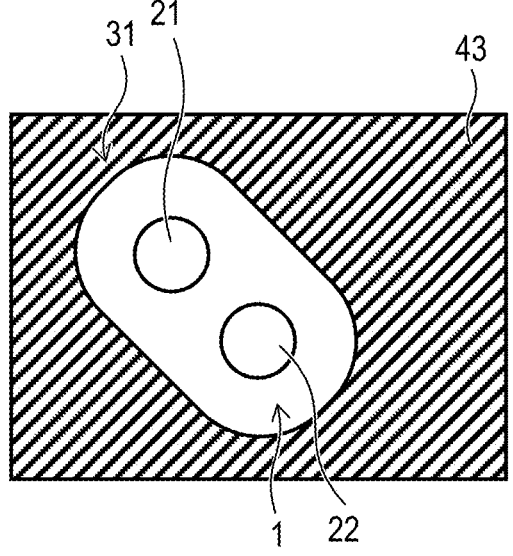
FIG. 7D is a plan view illustrating a conductor layer of the printed wiring board according to the fourth embodiment.

FIG. 7D illustrates the conductor layer 43, which is a middle layer in which the vias 21 and 22 are present. As illustrated in FIG. 7D, the clearance 1 is provided for the conductor layer 43 around the vias 21 and 22. The conductor layer 43 around the clearance 1 is the GND plane 31.

Figure 7E:
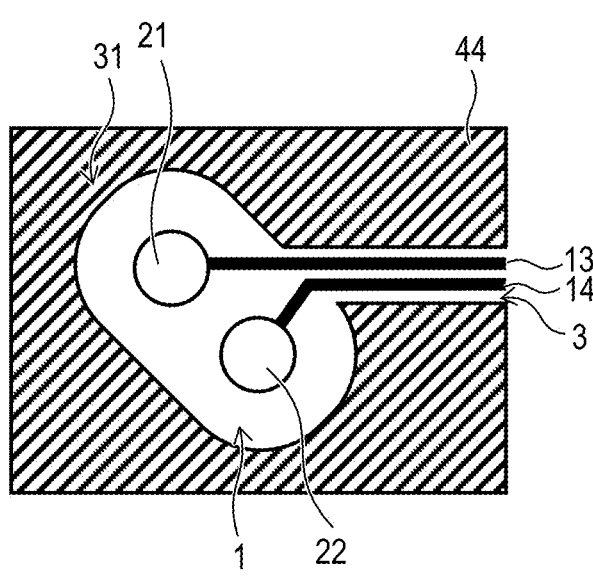
FIG. 7E is a plan view illustrating a conductor layer of the printed wiring board according to the fourth embodiment.

FIG. 7E illustrates conductor layer 44, which is the lowermost layer in which the vias 21 and 22 are present. As illustrated in FIG. 7E, the clearance 1 is provided for the conductor layer 44 around the vias 21 and 22. Furthermore, the opening 3 is provided for the conductor layer 44 so as to be connected to clearance 1 around and between wirings 13 and 14 connected to the vias 21 and 22, respectively. The conductor layer 44 around clearance 1 and the opening 3 is the GND plane 31.

Figure 7F:
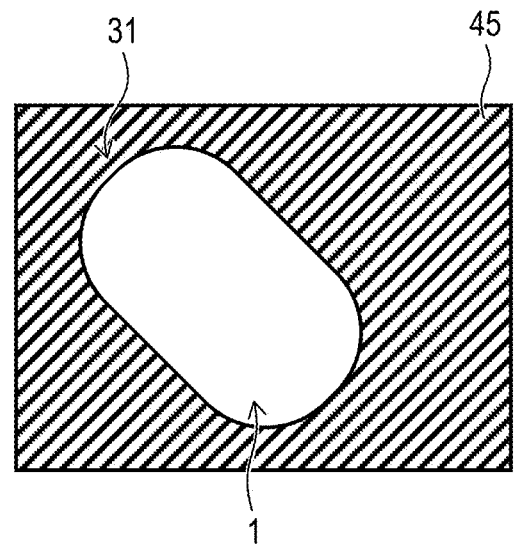
FIG. 7F is a plan view illustrating a conductor layer of the printed wiring board according to the fourth embodiment.

FIG. 7F illustrates the conductor layer 45 adjacent to the outer side of the conductor layer 44, which is the lowermost layer in which the vias 21 and 22 are present. As illustrated in FIG. 7F, the clearance 1 is provided for conductor layer 45 so as to include the vias 21 and 22 corresponding to the periphery of the vias 21 and 22. The conductor layer 45 around the clearance 1 is a GND plane 31.

The clearances 1 of the conductor layers 41, 42, 43, 44, and 45 have the same planar shape as each other in a plan view perpendicular to the printed wiring board 10, and are arranged so as to coincide with each other. In the plan view, clearances 1 are provided for the conductor layers 41, 42, 43, 44, and 45 so as to include the vias 21 and 22, respectively.

In the present embodiment, when the relative positions of the wiring on the P side and the wiring on the N side are not interchanged between the wirings 11 and 12 and the wirings 13 and 14, the clearances 1 are provided up to the conductor layers 41, 45 adjacent to the outer side of the uppermost and lowermost conductor layers 42 and 44 in which the vias 21 and 22 are present. Thus, in the present embodiment, even when the relative positions of the wiring on the P side and the wiring on the N side are not interchanged, the skew in the differential signal can be reduced, thereby the deterioration of transfer characteristics such as transmission characteristics of the differential signal can be reduced.

Fifth Embodiment

Figure 8A:
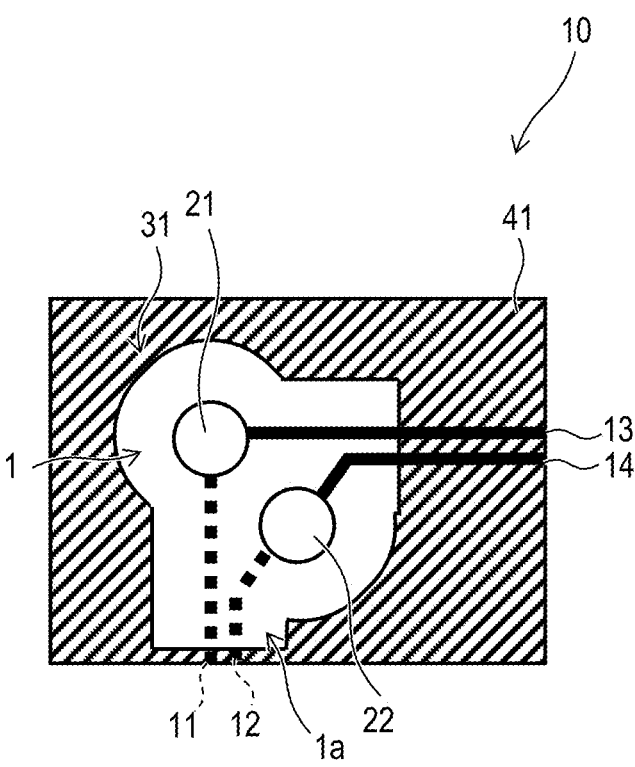
FIG. 8A is a transparent view from a top view illustrating a printed wiring board according to a fifth embodiment.

A printed wiring board according to a fifth embodiment of the present invention will be described with reference to FIG. 8A to FIG. 9. FIG. 8A is a transparent view from a top view illustrating the printed wiring board according to the present embodiment. FIG. 8B to FIG. 8F are plan views illustrating respective conductor layers of the printed wiring board according to the present embodiment. FIG. 9 is a plan view for explaining clearances in the printed wiring board according to the present embodiment. FIG. 8A to FIG. 9 are views viewed perpendicular to the printed wiring board. Note that the same components as those in the first to fourth embodiments are labeled with the same reference numerals and the description thereof will be omitted or simplified.

As illustrated in FIG. 8A, the basic configuration of the printed wiring board 10 according to the present embodiment is the same as that of the fourth embodiment. In the present embodiment, as in the fourth embodiment, the relative positions of the wiring on the P side and the wiring on the N side are not interchanged between the wirings 11 and 12 and the wirings 13 and 14.

The printed wiring board 10 according to the present embodiment differs from the fourth embodiment in the range of the clearance 1. FIG. 8B to FIG. 8F illustrate the clearances 1 provided for the conductor layers 41, 42, 43, 44 and 45 of the printed wiring board 10 according to the present embodiment.

Figure 8B:
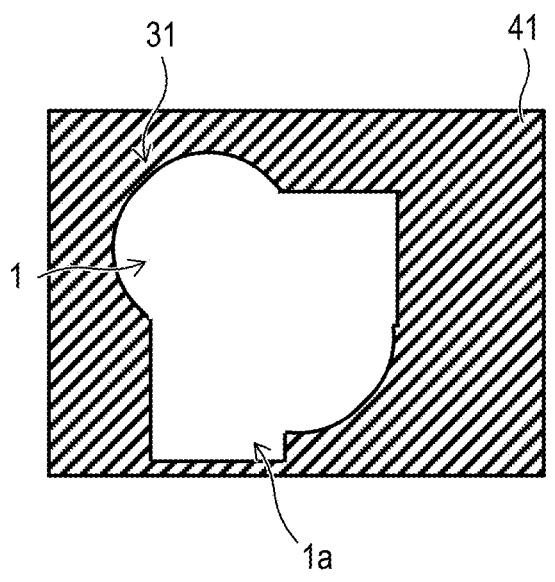
FIG. 8B is a plan view illustrating a conductor layer of the printed wiring board according to the fifth embodiment.
Figure 9:
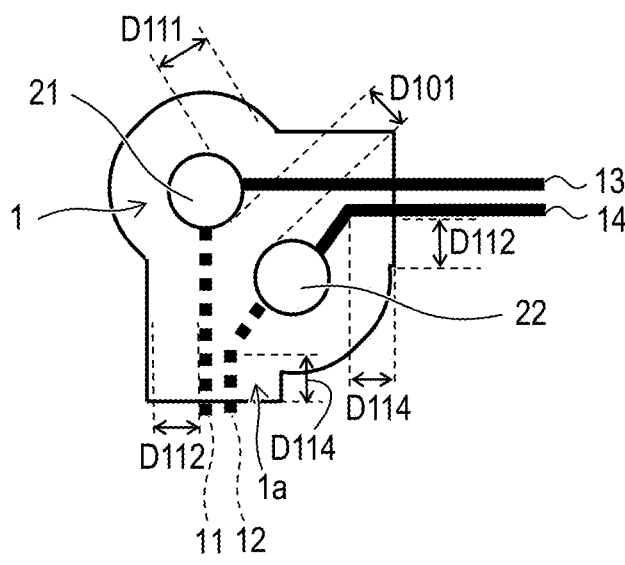
FIG. 9 is a plan view explaining clearance in the printed wiring board according to the fifth embodiment.

FIG. 8B illustrates the conductor layer 41 adjacent to the outer side of the conductor layer 42, which is the uppermost layer in which the vias 21 and 22 are present. As illustrated in FIG. 8B, the clearance 1 including the clearance 1a is provided for the conductor layer 41 so as to include the vias 21 and 22 corresponding to the periphery of the vias 21 and 22. The conductor layer 41 around the clearances 1 and 1a is the GND plane 31.

Figures 8C, 8D:
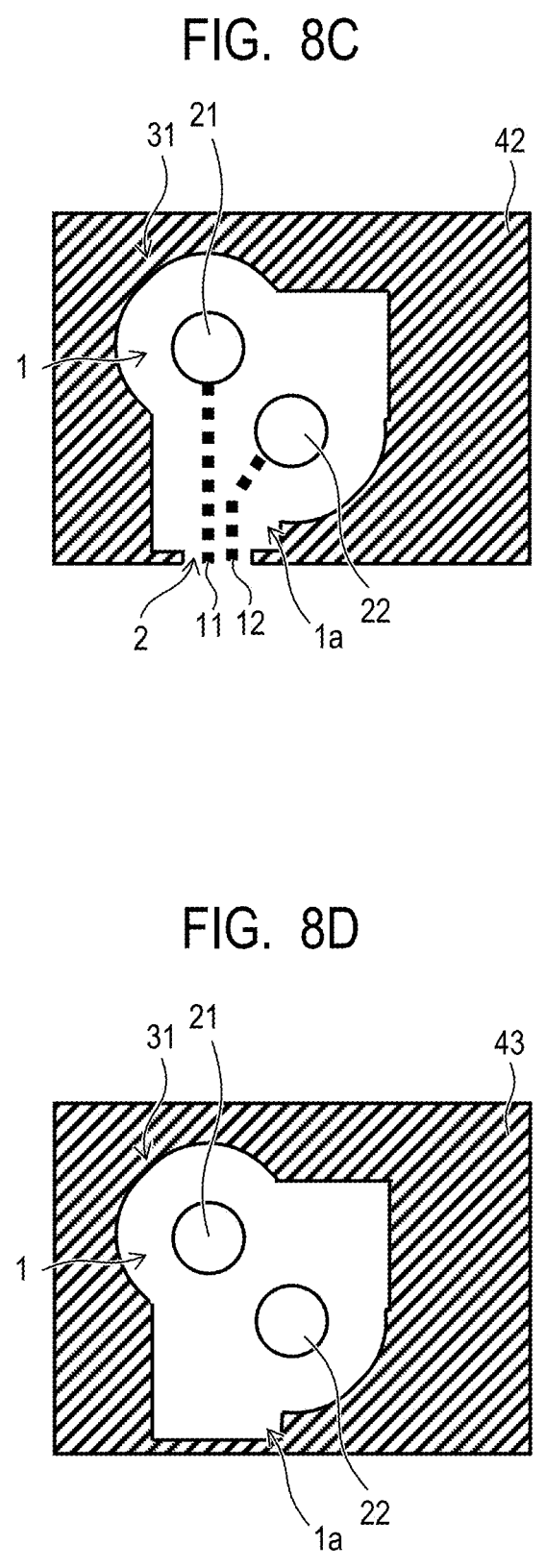

FIG. 8C illustrates the conductor layer 42, which is the uppermost layer in which the vias 21 and 22 are present. As illustrated in FIG. 8C, the clearance 1 including the clearance 1a is provided for the conductor layer 42 around the vias 21 and 22. Furthermore, the opening 2 is provided for the conductor layer 42 so as to be connected to the clearance 1 around and between the wirings 11 and 12 connected to the vias 21 and 22, respectively. The conductor layer 42 around the clearances 1 and 1a and the opening 2 is the GND plane 31.

FIG. 8D illustrates the conductor layer 43, which is a middle layer in which the vias 21 and 22 are present. As illustrated in FIG. 8D, the clearance 1 including the clearance 1a is provided for the conductor layer 43 around the vias 21 and 22. The conductor layer 43 around the clearances 1 and 1a is the GND plane 31.

Figure 8E:
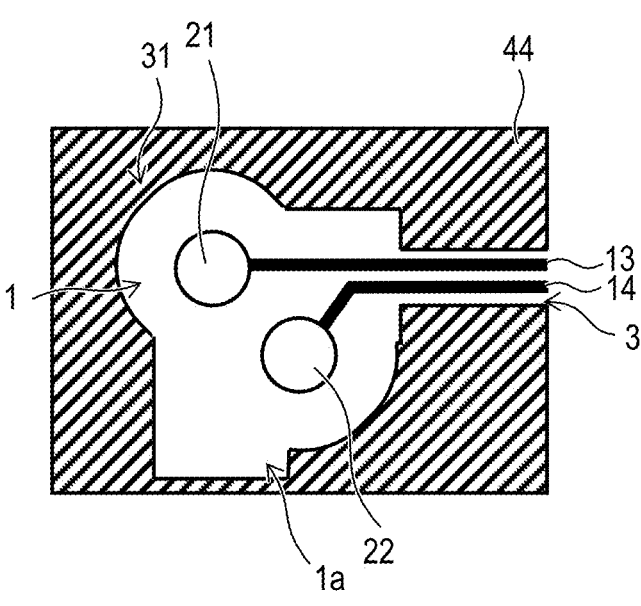
FIG. 8E is a plan view illustrating a conductor layer of the printed wiring board according to the fifth embodiment.

FIG. 8E illustrates the conductor layer 44, which is the lowermost layer in which the vias 21 and 22 are present. As illustrated in FIG. 8E, the clearance 1 including the clearance 1a is provided for the conductor layer 44 around the vias 21 and 22. Furthermore, the opening 3 is provided for the conductor layer 44 so as to be connected to the clearance 1 around and between the wirings 13 and 14 connected to the vias 21 and 22, respectively. The conductor layer 44 around the clearances 1 and 1a and the opening 3 is the GND plane 31.

Figure 8F:
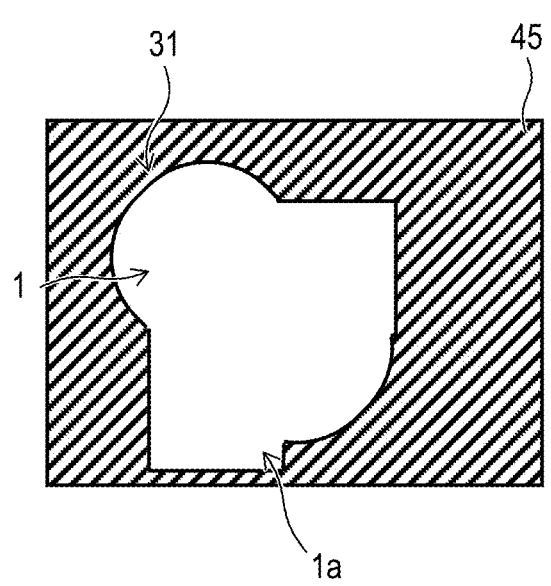
FIG. 8F is a plan view illustrating a conductor layer of the printed wiring board according to the fifth embodiment.

FIG. 8F illustrates the conductor layer 45 adjacent to the outer side of the conductor layer 44, which is the lowermost layer in which the vias 21 and 22 are present. As illustrated in FIG. 8F, the clearance 1 is provided for the conductor layer 45 so as to include the vias 21 and 22 corresponding to the periphery of the vias 21 and 22. The conductor layer 45 around the clearances 1 and 1a is the GND plane 31.

The clearances 1 including the clearances 1a of the respective conductor layers 41, 42, 43, 44, and 45 have the same planar shape as each other and are arranged so as to coincide with each other in a plan view viewed perpendicular to the printed wiring board 10. In the plan view, the clearances 1 including the clearances 1a are provided for the respective conductor layers 41, 42, 43, 44, and 45 so as to include the vias 21 and 22, respectively.

FIG. 9 illustrates the details of the clearance 1 including the clearance 1a according to the present embodiment. In the present embodiment as in the second and third embodiments, the clearance 1a is set as follows with respect to the distance D101 between the vias 21 and 22 in a plan view viewed perpendicular to the printed wiring board 10. That is, the clearance 1a is set to a range in which the distance D114 overlapped with the wirings 11 and 12 set at a constant wiring width and a constant spacing between the wirings is larger than the distance D101 with respect to the wirings 11 and 12 as viewed from the draw-out portion with respect to the vias 21 and 22. Furthermore, the clearance 1a is set to a range in which the distance D114 overlapped with the wirings 13 and 14 set at a constant wiring width and a constant spacing between the wirings is larger than the distance D101 with respect to the wirings 13 and 14 as viewed from the draw-out portions with respect to the vias 21 and 22. Note that the clearance 1a may be set to a range in which the clearance 1a overlaps with the wirings 11, 12, 13 and 14 set at a constant wiring width and a constant spacing between the wirings in a plan view perpendicular to the printed wiring board 10.

As in the present embodiment, the clearance 1 can be set to include the clearance 1a even when the relative positions of the wiring on the P side and the wiring on the N side are not interchanged between the wirings 11 and 12 and the wirings 13 and 14. Thus, according to the present embodiment, the skew between the P signal and the N signal in the differential signal can be further reduced.

Sixth Embodiment

Figure 10A:
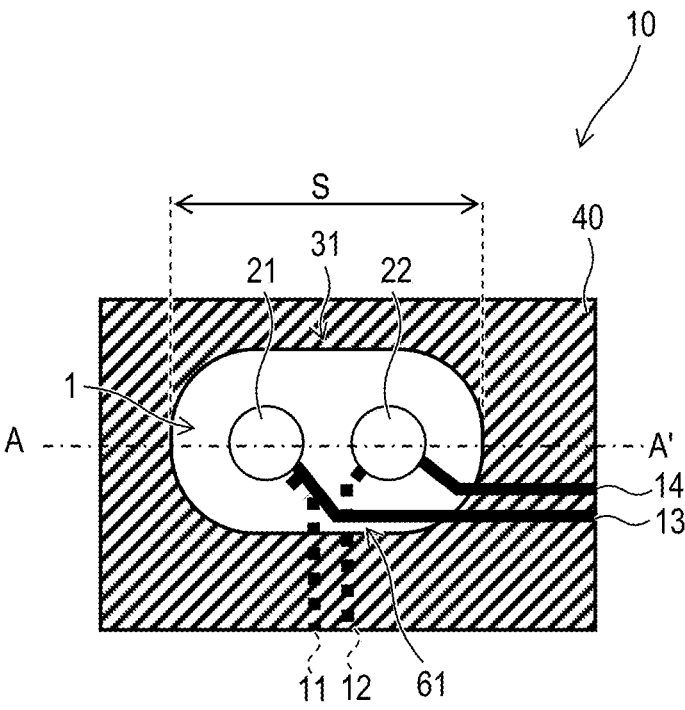
FIG. 10A is a transparent view from a top view illustrating a printed wiring board according to a sixth embodiment.
Figure 10B:
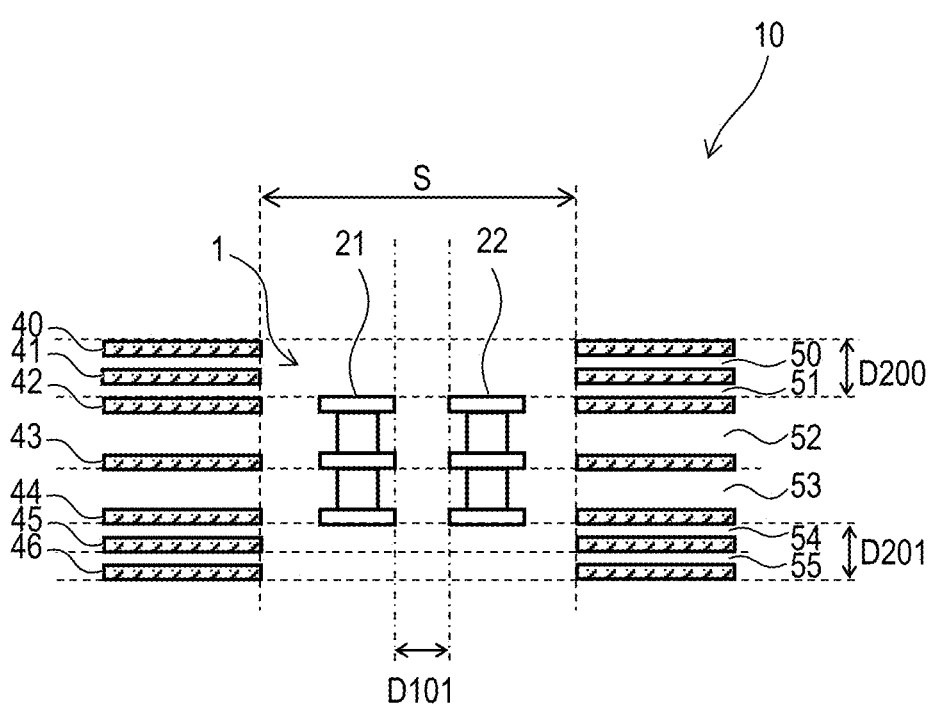
FIG. 10B is a cross-sectional view illustrating a cross section of the printed wiring board according to a sixth embodiment.

A printed wiring board according to a sixth embodiment of the present invention will be described with reference to FIG. 10A and FIG. 10B. FIG. 10A is a transparent view from a top view illustrating the printed wiring board according to the present embodiment. FIG. 10B is a cross-sectional view illustrating a cross section of the printed wiring board according to the present embodiment. FIG. 10A is a view viewed perpendicular to the printed wiring board. FIG. 10B illustrates a vertical cross section along line A-A' in FIG. 10A. Note that the same components as those in the first to fifth embodiments are labeled with the same reference numerals and the description thereof is omitted or simplified.

The basic configuration of the printed wiring board 10 according to the present embodiment is the same as that of the first embodiment. As illustrated in FIG. 10A and FIG.

10B, the printed wiring board 10 according to the present embodiment is a multilayer printed wiring board having conductor layers 40 and 46 in addition to five layers of the conductor layers 41, 42, 43, 44 and 45 similar to those of the first embodiment.

The conductor layer 40 is a conductor layer laminated on the outer side of the conductor layer 41 to be adjacent to the conductor layer 41 through an insulating layer 50. A clearance 1 is provided for the conductor layer 40 as in the conductor layer 41. The conductor layer 40 around the clearance 1 is a GND plane 31. A distance D200 between the conductor layer 40 and the conductor layer 42, which is the uppermost layer in which the vias 21 and 22 are present, is preferably set smaller than the distance D101 between the vias 21 and 22.

The conductor layer 46 is a conductor layer laminated on the outer side of the conductor layer 45 to be adjacent to the conductor layer 45 through an insulating layer 55. A clearance 1 is provided for the conductor layer 46 as for the conductor layer 45. The conductor layer 46 around the clearance 1 is a GND plane 31. A distance D201 between the conductor layer 46 and the conductor layer 44, which is the lowermost layer in which the vias 21 and 22 are present, is preferably set smaller than the distance D101 between the vias 21 and 22.

As in the present embodiment, the conductor layers 40 and 46 provided with the clearance 1 may be provided on the outer side of the conductor layers 41 and 45 to be adjacent to the conductor layers 41 and 45, respectively. Further provided with the conductor layers 40 and 46 provided with the clearances 1, the skew between the P signal and the N signal in the differential signal can be further reduced.

It is not necessary to provide both of the conductor layers 40 and 46, and either one of the conductor layers 40 and 46 may be provided. Furthermore, conductor layers similar to the conductor layers 40 and 46 may be provided on the outer side of the conductor layers 40 and 46 to be adjacent to the conductor layers 40 and 46 through insulating layers. Furthermore, in the second to fifth embodiments, the conductor layers 40 and 46 may be provided with the clearances 1 similar to the conductor layers 41 and 45, as in the present embodiment.

Seventh Embodiment

Figure 11A:
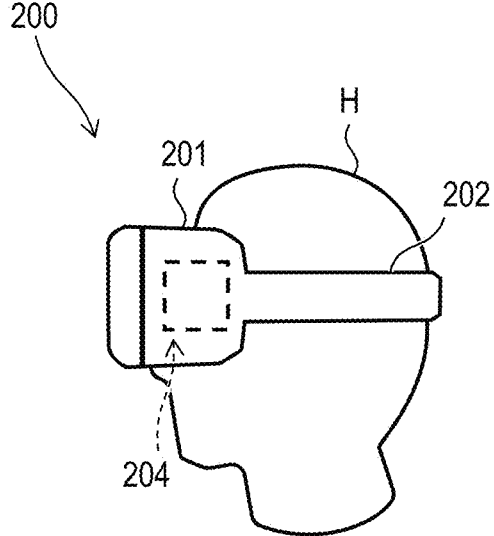
FIG. 11A is a side view illustrating a head mounted display as an example of electronic equipment according to a seventh embodiment.
Figure 11B:
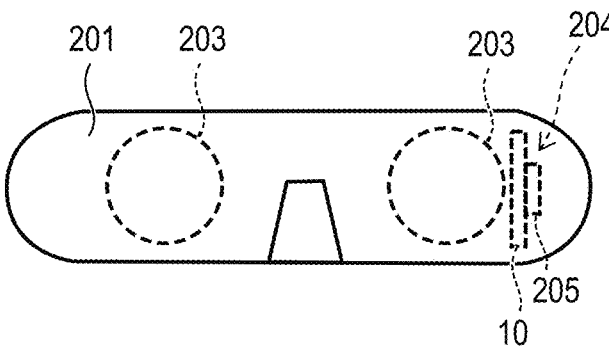
FIG. 11B is a front view illustrating the head mounted display as an example of the electronic equipment according to a seventh embodiment.

Electronic equipment according to a seventh embodiment of the present invention will be described with reference to FIG. 11A and FIG. 11B. FIG. 11A and FIG. 11B are schematic diagrams illustrating a head mounted display (HMD) as an example of the electronic equipment according to the present embodiment. FIG. 11A is a side view of the HMD, and FIG. 11B is a front view of the HMD. Note that the same components as those in the first to sixth embodiments are labeled with the same reference numerals, and the description thereof will be omitted or simplified. In the present embodiment, the HMD which is a display device will be described as an example of the electronic equipment using the printed wiring board 10 according to any of the first to sixth embodiments.

As illustrated in FIG. 11A and FIG. 11B, the HMD 200 includes a housing 201, a mounting tool 202, display units 203 for the left eye and the right eye, and a control unit 204. Each of the display units 203 and the control unit 204 are housed and arranged in the housing 201. The display units 203 for the left eye and the right eye are display units that display images for the left eye and the right eye, respectively. The control unit 204 is a control unit that controls the operation of the HMD 200 including each of the display units 203 and the like.

The control unit 204 is a printed circuit board including the printed wiring board 10 according to any of the first to sixth embodiments and a semiconductor device 205 as a component mounted on the printed wiring board 10. The semiconductor device 205 controls the respective parts of the HMD 200 such as the display units 203 and the like, and transmits and receives signals such as a video signal and a control signal by using differential signal wirings constituted by the wirings 11, 12, 13, and 14 in the printed wiring board 10.

As in the present embodiment, the printed wiring board 10 according to any of the first to sixth embodiments can be used in the HMD 200. Note that the printed wiring board 10 according to any of the first to sixth embodiments can be used in the HMD 200 as well as electronic equipment such as computers, displays, video equipment, and the like. In the electronic equipment, the printed wiring board 10 is used as a printed circuit board on which various components such as semiconductor devices are mounted.

Example

The improvement effect of the skew according to the above embodiments and its mechanism will be described with reference to FIG. 12A to FIG. 13.

Figure 12A:
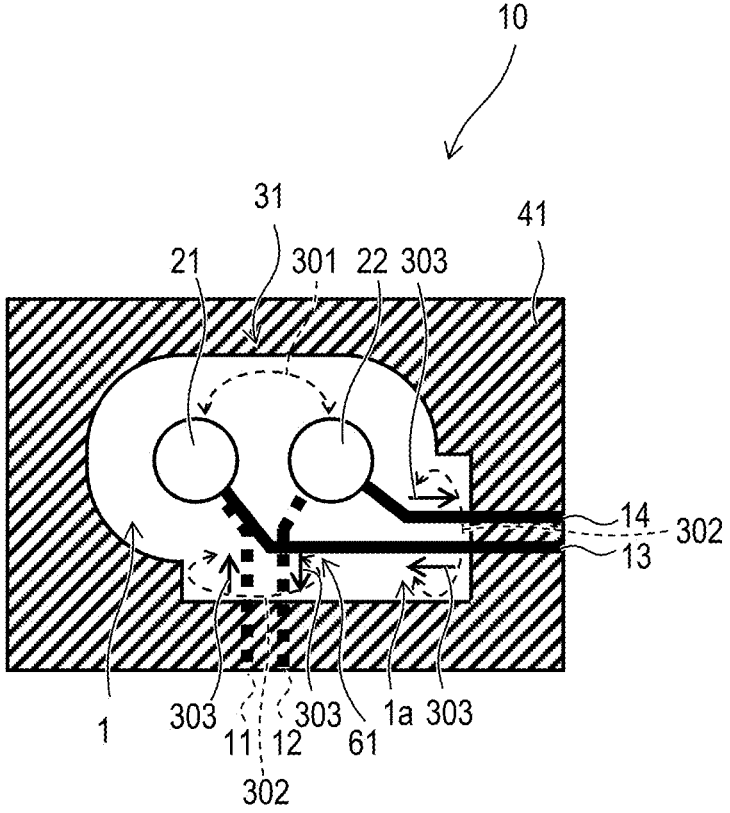
FIG. 12A is a transparent view from a top view illustrating a printed wiring board according to an example.
Figure 12B:
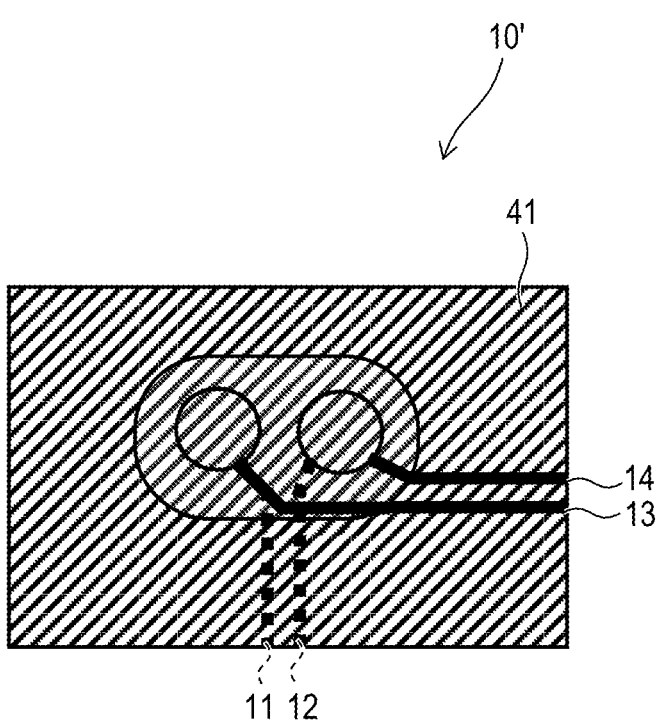
FIG. 12B is a transparent view from a top view illustrating a printed wiring board according to a comparative example.

FIG. 12A is a transparent view from a top view illustrating the printed wiring board 10 of an example. FIG. 12B is a transparent view from a top view illustrating the printed wiring board 10' of a comparative example. The example illustrated in FIG. 12A had a configuration corresponding to the printed wiring board 10 according to the second embodiment. In the example, in order to enhance the coupling effect of the wiring and the vias, the clearances 1 were increased, and the clearances 1 were provided to the conductor layer 41 above the uppermost conductor layer 42 in which the vias 21 and 22 were present and the conductor layer 45 below the lowermost conductor layer 44 in which the vias 21 and 22 were present. Furthermore, in the example, the clearances 1a which overlapped up to the wiring portion is provided. In the comparative example, the clearances 1 were not provided for the conductor layers 41 and 45 in the printed wiring board 10 according to the first embodiment.

Simulations were performed on the example and the comparative example to compare skews. As a result of the simulations, the skew of the example was 10.7 ps, while the skew of the comparative example was 10.2. Thus, the skew of the example was improved compared with that of the comparative example, and it can be seen that the improvement of the skew is effective.

In the example, it is considered that the coupling between the vias 21 and 22 indicated by the dashed line 301, the coupling between the wirings 11 and 12 indicated by the dashed line 302, the coupling between the wirings 13 and 14 also indicated by the dashed line 302, and the coupling between the vias and the wirings not illustrated were enhanced. As a result, in the example, as illustrated by the arrows 303, the return currents due to the signal currents and the couplings were generated in the wirings 11, 12, 13, and 14, and the skew were improved by these return currents.

Figure 12C:
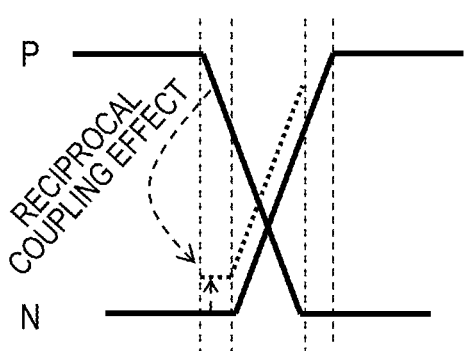
FIG. 12C is a diagram illustrating waveforms of a P signal and an N signal of the example.
Figure 12D:
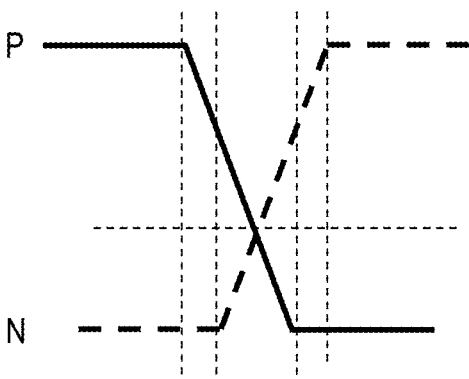
FIG. 12D is a diagram illustrating waveforms of a P signal and an N signal of the comparative example.

FIG. 12D illustrates the waveforms of the P signal and the N signal in the case of the comparative example illustrated in FIG. 12B. As illustrated in FIG. 12D, in the comparative example, the skew occurred due to the difference in the wiring length.

FIG. 12C illustrates waveforms of the P signal and the N signal in the case of the example illustrated in FIG. 12A. As illustrated in FIG. 12C, in the example, the skew occurred due to the difference in the wiring length, but the skew was reduced compared with the comparative example.

Figure 13:
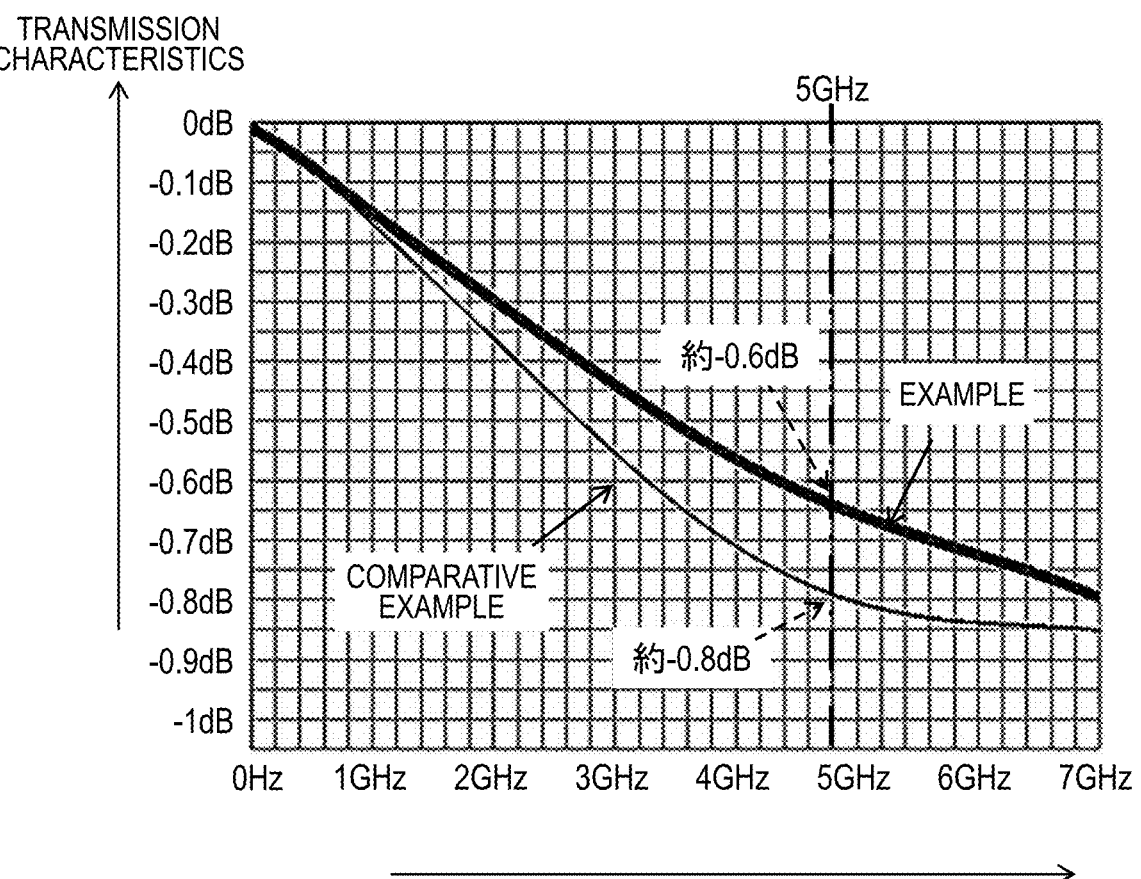
FIG. 13 is a graph illustrating transmission characteristics of the example and the comparative example.

FIG. 13 is a graph illustrating the transmission characteristics of the example and the comparative example. In FIG. 13, the vertical axis indicates the transmission characteristics, and the higher the vertical axis, the better the transmission characteristics are. The horizontal axis indicates the frequency, and indicates that the transmission characteristics were confirmed from 0 Hz to 7 GHz. From the graph illustrated in FIG. 13, it can be seen that the transmission characteristics were improved in the example compared with the comparative example. For example, assuming a signal of 10 Gbps, the frequency was confirmed at 5 GHz, which was half of the signal. In this case, the transmission characteristics were improved to −0.6 dB in the example compared with −0.8 dB in the comparative example.

The present invention is not limited to the above-described embodiments, and many modifications are possible within the technical concept of the present invention. Furthermore, the effects described in the embodiments only list the most suitable effects resulting from the present invention, and the effects of the present invention are not limited to those described in the embodiments.

According to the present invention, the skew in the differential signal can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-114352, filed Jul. 12, 2023, which is hereby incorporated by reference herein in its entirety.

What is claimed is:

1. A printed wiring board comprising:
a substrate including a first conductor layer and a second conductor layer laminated together, and a third conductor layer laminated on an outer side of one of the first conductor layer and the second conductor layer;
a first differential signal wiring provided in the first conductor layer and including a first wiring and a second wiring;
a second differential signal wiring provided in the second conductor layer and including a third wiring and a fourth wiring;
a first via provided between the first conductor layer and the second conductor layer to connect the first wiring and the third wiring; and
a second via provided between the first conductor layer and the second conductor layer to connect the second wiring and the fourth wiring,
wherein a first clearance is provided for each of the first conductor layer, the second conductor layer, and the third conductor layer to include the first via and the second via in a plan view viewed perpendicular to the substrate, and
wherein wiring lengths of the first wiring and the third wiring and wiring lengths of the second wiring and the fourth wiring are different from each other.

2. The printed wiring board according to claim 1,
wherein the first wiring and the second wiring have a first portion in which wiring widths and a spacing are constant, and wherein the first clearance is provided to cover the first portion in the plan view.

3. The printed wiring board according to claim 2, wherein the third wiring and the fourth wiring have a second portion in which wiring widths and a spacing are constant, and wherein the first clearance is provided to cover the second portion in the plan view.

4. The printed wiring board according to claim 3, wherein a distance by which the first clearance covers the second portion in the plan view is larger than the distance between the first via and the second via.

5. The printed wiring board according to claim 2, wherein a distance by which the first clearance covers the first portion in the plan view is larger than a distance between the first via and the second via.

6. The printed wiring board according to claim 1, comprising a fourth conductor layer laminated on an outer side of the other of the first conductor layer and the second conductor layer,
wherein a second clearance is provided for the fourth conductor layer to include the first via and the second via in the plan view.

7. The printed wiring board according to claim 1, comprising a fourth conductor layer laminated on an outer side of the third conductor layer,
wherein a third clearance is provided for the fourth conductor layer to include the first via and the second via in the plan view.

8. The printed wiring board according to claim 7, wherein a distance between the first conductor layer or the second conductor layer on the outer side of which the third conductor layer is adjacent to and the fourth conductor layer is larger than a distance between the first via and the second via.

9. A printed circuit board comprising:
the printed wiring board according to claim 1; and
a component mounted on the printed wiring board.

10. Electronic equipment comprising:
a housing; and
the printed circuit board according to claim 9.

11. A head mounted display comprising:
a housing;
a display unit that is arranged inside the housing and displays an image;
the printed wiring board according to claim 1 that is arranged inside the housing; and
a semiconductor device that is mounted on the printed wiring board and controls the display unit.

12. A printed wiring board comprising:
a substrate including a first conductor layer and a second conductor layer laminated together, and a third conductor layer laminated on an outer side of one of the first conductor layer and the second conductor layer;
a first differential signal wiring provided in the first conductor layer and including a first wiring and a second wiring;
a second differential signal wiring provided in the second conductor layer and including a third wiring and a fourth wiring;
a first via provided between the first conductor layer and the second conductor layer to connect the first wiring and the third wiring; and a second via provided between the first conductor layer and the second conductor layer to connect the second wiring and the fourth wiring,
wherein a first clearance is provided for each of the first conductor layer, the second conductor layer, and the third conductor layer to include the first via and the second via in a plan view viewed perpendicular to the substrate, and
wherein the first wiring, the second wiring, the third wiring, and the fourth wiring are arranged so that any one of the first wiring and the second wiring intersects any one of the third wiring and the fourth wiring in the plan view.

13. The printed wiring board according to claim 12, wherein the first clearance is provided to include a region in which one of the first wiring and the second wiring intersects one of the third wiring and the fourth wiring in the plan view.

14. The printed wiring board according to claim 1, wherein the first wiring, the second wiring, the third wiring, and the fourth wiring are arranged so that the first wiring does not intersect either the third wiring or the fourth wiring, and the second wiring does not intersect either the third wiring or the fourth wiring in the plan view.

15. The printed wiring board according to claim 12, wherein wiring lengths of the first wiring and the third wiring and wiring lengths of the second wiring and the fourth wiring are different from each other.

16. The printed wiring board according to claim 12, wherein the first wiring, the second wiring, the third wiring, and the fourth wiring are arranged so that the first wiring does not intersect either the third wiring or the fourth wiring, and the second wiring does not intersect either the third wiring or the fourth wiring in the plan view.

17. The printed wiring board according to claim 12, wherein the first wiring and the second wiring have a first portion in which wiring widths and a spacing are constant, and wherein the first clearance is provided to cover the first portion in the plan view.

18. The printed wiring board according to claim 12, comprising a fourth conductor layer laminated on an outer side of the other of the first conductor layer and the second conductor layer,
wherein a second clearance is provided for the fourth conductor layer to include the first via and the second via in the plan view.

19. Electronic equipment comprising:
a housing; and
a printed circuit board,
wherein the printed circuit board comprises:
the printed wiring board according to claim 12; and
a component mounted on the printed wiring board.

20. A head mounted display comprising:
a housing;
a display unit that is arranged inside the housing and displays an image;
the printed wiring board according to claim 12 that is arranged inside the housing; and
a semiconductor device that is mounted on the printed wiring board and controls the display unit.

* * * * *